(12) United States Patent
Nagumo

(10) Patent No.: US 9,048,841 B2
(45) Date of Patent: Jun. 2, 2015

(54) DRIVER CIRCUIT, DRIVER APPARATUS, AND IMAGE FORMING APPARATUS

(75) Inventor: Akira Nagumo, Takasaki (JP)

(73) Assignee: Oki Data Corporation, Tokyo (JP)

( * ) Notice: Subject to any disclaimer, the term of this patent is extended or adjusted under 35 U.S.C. 154(b) by 262 days.

(21) Appl. No.: 12/926,680

(22) Filed: Dec. 3, 2010

(65) Prior Publication Data

US 2011/0133789 A1    Jun. 9, 2011

(30) Foreign Application Priority Data

Dec. 4, 2009   (JP) ................................ 2009-276628

(51) Int. Cl.
| | |
|---|---|
| G06K 15/00 | (2006.01) |
| H03K 17/725 | (2006.01) |
| G09G 3/20 | (2006.01) |
| H03K 17/79 | (2006.01) |
| H03K 17/081 | (2006.01) |

(52) U.S. Cl.
CPC .......... *H03K 17/79* (2013.01); *H03K 17/08108* (2013.01)

(58) Field of Classification Search
USPC ............. 348/801, 355; 345/76–107, 204–215
See application file for complete search history.

(56) References Cited

U.S. PATENT DOCUMENTS

| | | | |
|---|---|---|---|
| 6,909,258 B2 * | 6/2005 | Milazzotto et al. ........... 318/811 |
| 8,159,418 B2 * | 4/2012 | Yang ................. 345/60 |
| 2003/0179118 A1 * | 9/2003 | Mizutani et al. .............. 341/118 |
| 2004/0021496 A1 * | 2/2004 | Shin ............................... 327/333 |
| 2006/0028272 A1 * | 2/2006 | Ozawa et al. .................. 330/251 |
| 2007/0058030 A1 * | 3/2007 | Nagumo ........................ 347/247 |
| 2007/0195015 A1 * | 8/2007 | Bezal et al. ..................... 345/68 |
| 2009/0108904 A1 * | 4/2009 | Shiffer, II ...................... 327/333 |
| 2009/0167836 A1 * | 7/2009 | Nagumo ........................ 347/247 |
| 2009/0256785 A1 * | 10/2009 | Sung et al. ....................... 345/77 |

FOREIGN PATENT DOCUMENTS

| | | |
|---|---|---|
| JP | 61-170129 A | 7/1986 |
| JP | 02-264519 A | 10/1990 |
| JP | 03-034719 A | 2/1991 |
| JP | 04-357712 A | 12/1992 |
| JP | 08-153890 A | 6/1996 |
| JP | 11-055103 A | 2/1999 |
| JP | 2001-217460 A | 8/2001 |
| JP | 2002-151650 A | 5/2002 |
| JP | 2009-158809 A | 7/2009 |

* cited by examiner

*Primary Examiner* — Marivelisse Santiago Cordero
*Assistant Examiner* — Kevin Ky
(74) *Attorney, Agent, or Firm* — Rabin & Berdo, P.C.

(57) ABSTRACT

A driver circuit drives a plurality of groups of light emitting elements. Each element includes an anode, a cathode connected to the ground, and a gate that controls electrical conduction between the anode and cathode. A first driver section simultaneously drives the anodes of the elements of the plurality of groups of elements. A second driver section simultaneously drives the gates of the elements in a corresponding group of the plurality of groups. The second driver section includes a series connection of a first switch element and a voltage level shifter. The series connection is connected between a power supply and the group of gates. The second driver section further includes a second switch element connected between the group of gates and the ground.

18 Claims, 30 Drawing Sheets

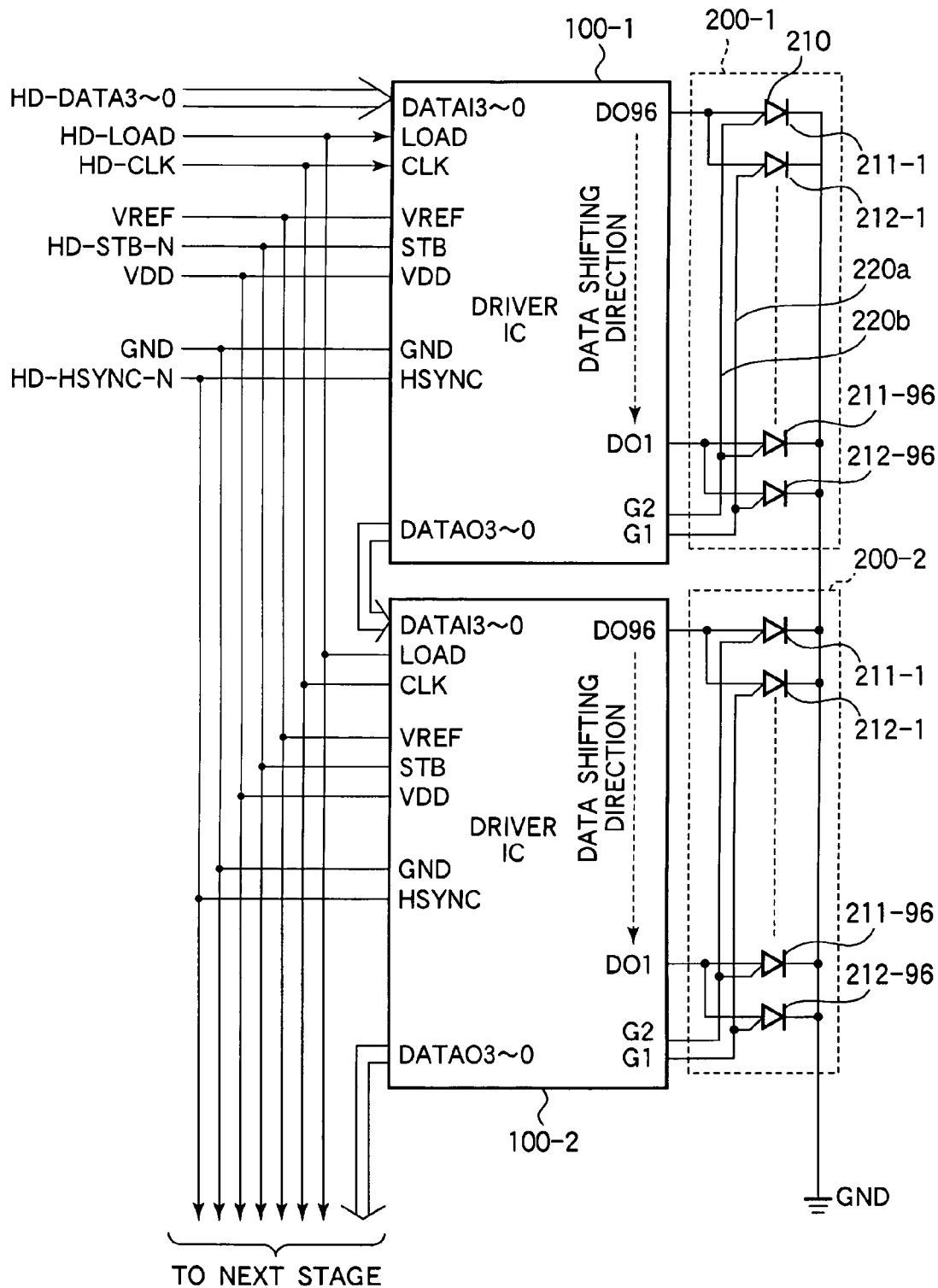

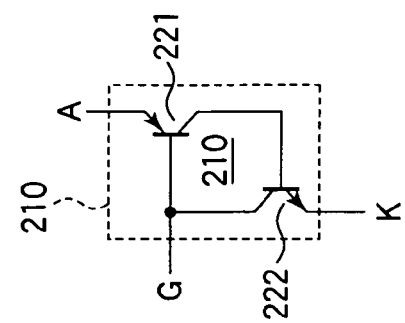
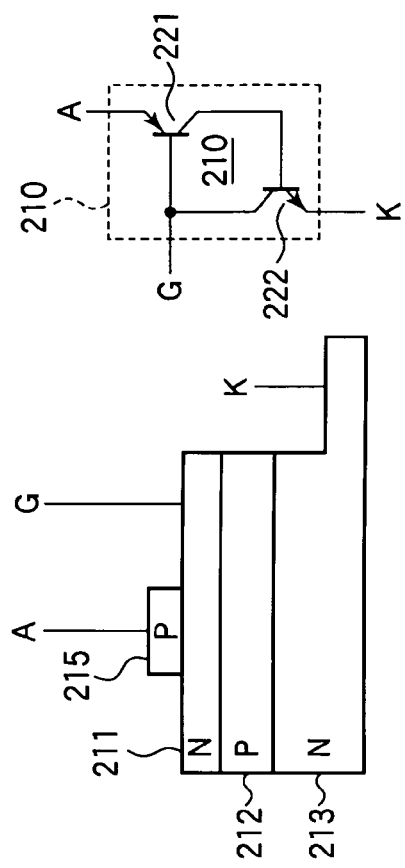
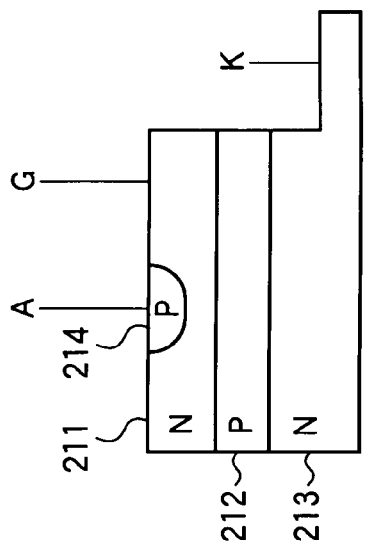
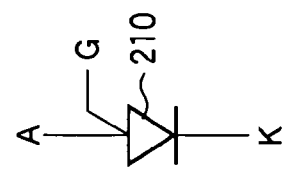

MULTIPLEXER 161

DRIVER 181

SIGNAL SELECTOR 142

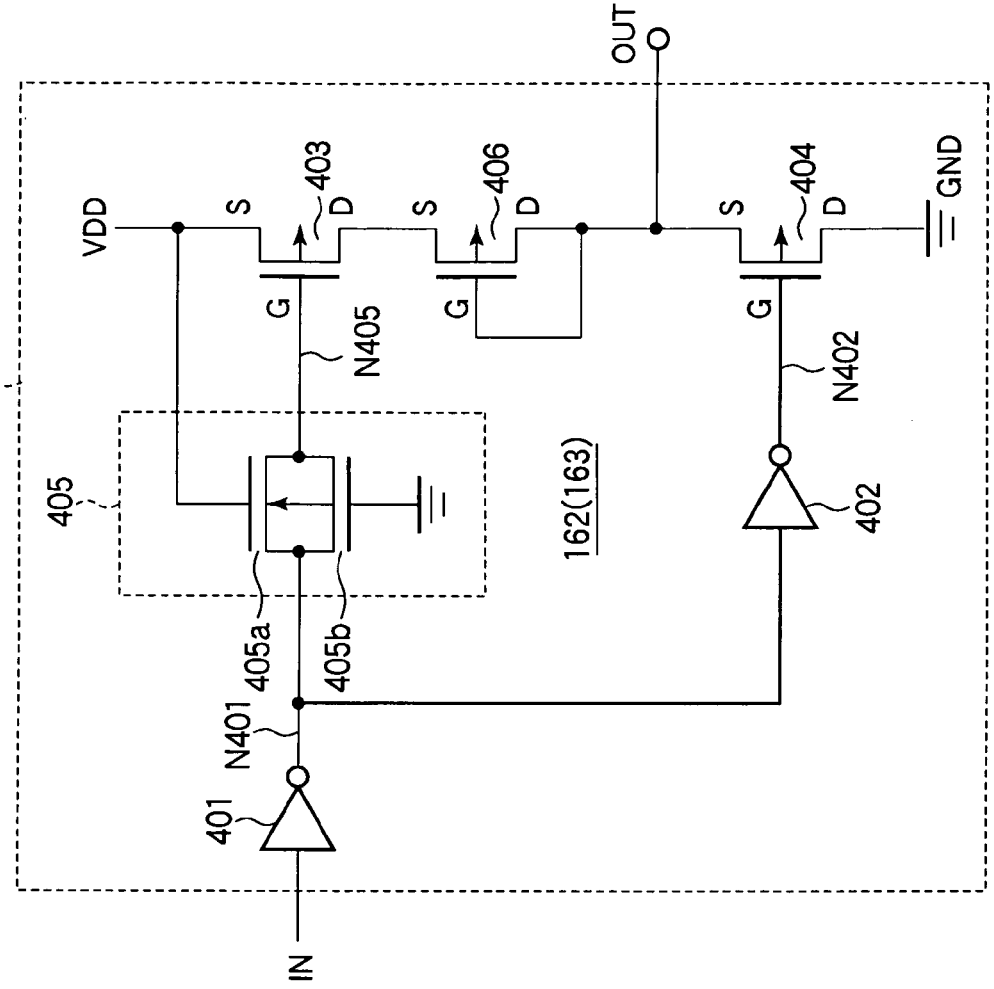
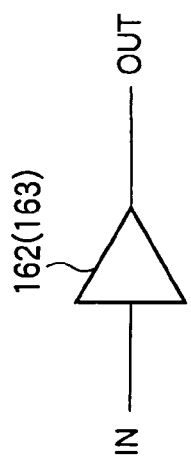
FIG.14B
FIG.14A

DRIVER CIRCUIT, DRIVER APPARATUS, AND IMAGE FORMING APPARATUS

BACKGROUND OF THE INVENTION

Field of the Invention

The present invention relates to a driver circuit for cyclically selectively driving a row of a plurality of elements, e.g., light emitting thyristors as a light source for an electrophotographic printer, a driving apparatus that employs the driver circuit, and an image forming apparatus that employs the driving apparatus.

Some existing image forming apparatus such as an electrophotographic printer employ an exposing unit that includes a plurality of light emitting elements. The light emitting elements include light emitting diodes (LEDs), an organic electroluminescence (organic EL), and light emitting thyristors.

An exposing unit using LEDs includes a driver circuit for a corresponding LED or a driver circuit for a group of LEDs. The LED turns on to emit light when current flows from anode to cathode of the LED and turns off when current does not flow. The light output of an LED depends on the drive current therethrough, and can be controlled by adjusting the drive current.

A well known configuration of the driver circuit is such that MOS transistors are operated in their saturation region to perform a constant current function.

Another well known driver circuit includes an anode driver circuit and a cathode driver circuit, and is employed in an optical print head using light emitting thyristors. One such driver circuit is disclosed in Japanese Patent Application Laid-Open No. 08-153890. Light emitting thyristors are of N type conductivity gate configuration of semiconductor layers of a PNPN structure which includes a first layer or an anode of P-type conductivity, a second layer or a gate terminal of an N-type conductivity type, and a fourth layer or a cathode of an N-type conductivity. A plurality of groups of light emitting thyristors are driven in a time division manner, each group including a plurality of light emitting thyristors which are aligned side by side and have their anodes connected together and their gates connected together.

Existing driver circuits and driving apparatus suffer from the following drawbacks. When a group of light emitting thyristors are driven in a time division manner, the gates of selected light emitting thyristors are set to the Low level and those of non-selected light emitting thyristors are set to the High level.

The driver ICs for driving the group of thyristors are monolithic ICs manufactured by a CMOS transistor process, and operate at a supply voltage of 5 volts. An existing driver circuit applies a logic signal of the H level, which is substantially equal to the supply voltage of 5 V, to the gate of the light emitting thyristor. Light emitting thyristors sustain a voltage of only about 7 V, which has not a sufficient margin against the supply voltage of 5 V. Thus, the gate voltage of the H level may break down the thyristor.

A reverse gate voltage is applied across the second layer (N-type layer) and the third layer (P-type layer) of the light emitting thyristor. The reverse breakdown voltage of a PN junction is known to be about 15 volts. The gate-to-cathode sustaining voltage of the thyristor is equal to a collector sustaining voltage $Vceo(max)$ of an NPN transistor as follows: $Vceo(max)=BV/\beta^{1/n}$ where BV is the reverse breakdown voltage of a PN reverse junction, $\beta$ is the current amplification factor of an NPN transistor, and n is an empirical coefficient in the range of 3 to 6. The light emitting thyristors have a sustaining voltage of only about 7 V, which is not a sufficient margin relative to the supply voltage of 5 V. Thus, the gate voltage of the H level may cause breakdown of the thyristors.

For gallium arsenide, GaAs, the value of Vceo(max) is obtained as follows:

$$Vceo(max)=15/50^{1/6}=7.8\ V$$

where is $\beta=50$, $n=6$, and BV is 15 V.

A Vceo(max) of 7.8 V may not have a sufficient voltage margin relative to a common power supply voltage of 5 V at which driver circuits operate. An insufficient Vceo (max) may cause problems such as breakdown of light emitting thyristors and deterioration of light emitting thyristors due to application of 5 V for a long period of time. Such deterioration of thyristors includes fluctuation in light output and decreased switching speed resulting from deterioration of current amplification.

In order to improve the switching speed of light emitting thyristors, the current amplification of NPN transistors needs to be increased. However, increasing current amplification will deteriorate Vceo (max). This implies that the reverse breakdown voltage of a PN junction cannot be increased independently of Vceo(max). In other words, switching speed and Vceo(max) are two opposing factors. Thus, there is a need for a good solution.

SUMMARY OF THE INVENTION

An object of the invention is to solve the aforementioned prior art problems and to provide A driver circuit drives a plurality of groups of light emitting elements. Each element includes an anode, a cathode connected to the ground, and a gate that controls electrical conduction between the anode and cathode. A first driver section simultaneously drives the anodes of the elements of the plurality of groups of elements. A second driver section simultaneously drives the gates of the elements in a corresponding group of the plurality of groups. The second driver section includes a series connection of a first switch element and a voltage level shifter. The series connection is connected between a power supply and the group of gates. The second driver section further includes a second switch element connected between the group of gates and the ground.

A driver circuit drives a plurality of groups of light emitting elements. Each element includes an anode, a cathode connected to the ground, and a gate that controls electrical conduction between the anode and cathode. A first driver section drives simultaneously first terminals of the elements of the plurality of groups of elements. A second driver section simultaneously drives third terminals of elements in a corresponding group of the plurality of groups. The second driver section includes a first switch element connected between a second node at a second potential and the group of third terminals. The second driver section further includes a second switch element connected between the third terminals and the first node, the second switch element having a different conductivity type from the first switch element.

A driver circuit for driving a plurality of groups of elements, each element including a first terminal, a second terminal connected to a first node at a first potential, and a third terminal that controls electrical conduction between the first terminal and the second terminal. A first driver section simultaneously drives first terminals of the elements of the plurality of groups of elements. A second driver section simultaneously drives third terminals of elements in a corresponding group of the plurality of groups. The second driver section includes a series connection of a first switch element and a forward-biased diode, the series circuit being connected between a second node at a second potential and the group of third terminals. The second driver section further including a second switch element connected between the third terminals and the first node, the second switch element being of a common conductivity type to the first switch element.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 5 illustrates the circuit configuration of the optical print head 13 shown in FIG. 4;

FIG. 6A illustrates the symbol of the thyristor;

FIG. 6B is a cross-sectional view of the thyristor;

FIG. 6C is a cross-sectional view of another structure of the light emitting thyristor;

FIG. 6D is an equivalent circuit of the thyristors shown in FIGS. 6B and 6C;

FIGS. 14A and 14B illustrate the configuration of the first and second gate drivers shown in FIG. 7;

DETAILED DESCRIPTION OF THE INVENTION

{Outline of Image Forming Apparatus}

Figure 1:
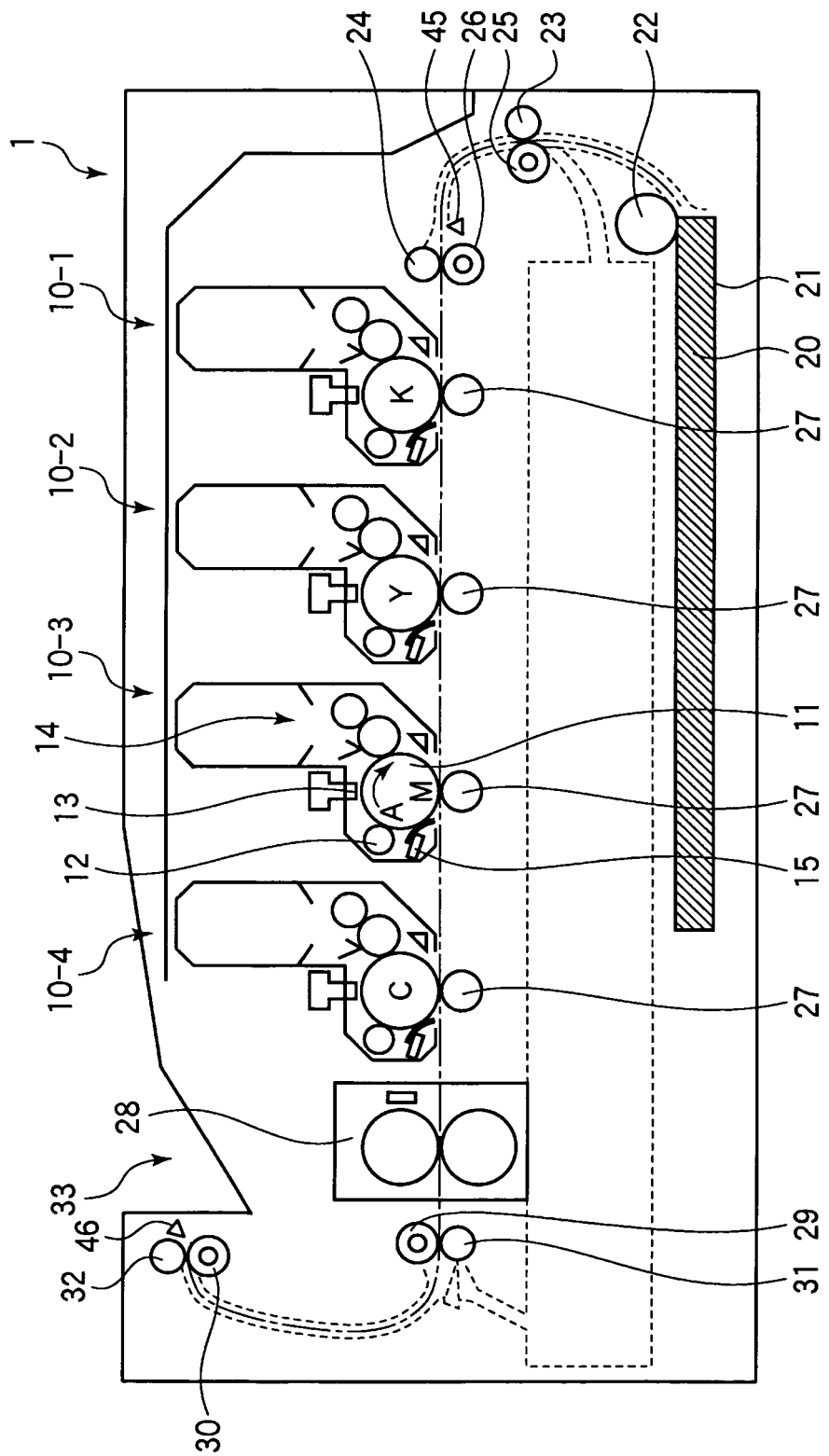
FIG. 1 illustrates the outline of an image forming apparatus according to a first embodiment.

FIG. 1 illustrates the outline of an image forming apparatus according to a first embodiment.

The image forming apparatus 1 is an electrophotographic color printer that employs a driver apparatus, e.g., an optical print head for driving light emitting elements, e.g., three-terminal thyristors. The image forming apparatus 1 includes four process units 10-1 to 10-4 that form black (K), yellow (Y), magenta (M), and cyan (C) images, respectively. The four process units are aligned from upstream to downstream of a transport path of a recording medium, e.g., paper 20. Each of the process units may be substantially identical; for simplicity only the operation of the process unit 10-3 for forming cyan images will be described, it being understood that the other process units may work in a similar fashion.

The process unit 10-3 includes a photoconductive drum 11 rotatable in a direction shown by arrow A. A charging unit 12, an exposing unit, e.g., an optical print head 13, a developing unit 14, and a cleaning device 15 are disposed in this order around the photoconductive drum 11. The charging unit 12 charges the surface of the photoconductive drum 11. The exposing unit 13 selectively illuminates the charged surface of the photoconductive drum 11 to form an electrostatic latent image. The developing unit 14 deposits magenta toner to the electrostatic latent image formed on the photoconductive drum 11 to form a toner image. The cleaning device 15 removes toner remaining on the photoconductive drum 11 after transferring the toner image onto the paper 20. A drive source (not shown) drives the photoconductive drum 11 and a variety of rollers in rotation via a gear train.

A paper cassette 21, which holds a stack of paper 20 therein, is disposed at a lower portion of the image forming apparatus 1. A hopping roller 22 is disposed over the paper cassette 21, and feeds the paper 20 on a sheet-by-sheet basis into the transport path. A discharge roller 25 cooperates with pinch rollers 23 and 24 to hold the paper 20 in a sandwiched relation. A registry roller 26 corrects the skew of the paper 20, and transports the paper 20 to the process unit 10-1. The discharge roller 25 and registry roller 26 are disposed downstream of the hopping roller 22. A drive source (not shown) drives the hopping roller 22, discharge roller 25, and registry roller 26 in rotation via a gear train.

Transfer units 27 are formed of, for example, a semi-conductive rubber material, and parallel the photoconductive drums 11 of the process units 10-1 to 10-4. When the toner images formed on the photoconductive drums 11 are transferred onto the paper 20, the transfer units 27 receive voltages so as to create a potential difference across each transfer unit 27 and the surface of a corresponding photoconductive drum 11.

A fixing unit 28 is located downstream of the process unit 10-4, and includes a heat roller, which incorporates a heater therein, and a pressure roller. When the paper 20 passes through the gap between the pressure roller and the heat roller, the toner image on the paper 20 is fixed under heat and pressure. Discharge rollers 29 and 30, discharge pinch rollers 31 and 32, and a paper stacker 33 are disposed downstream of the fixing unit 28. The discharge rollers 29 and 30 cooperate with the pressure roller to hold the paper 20 in a sandwiched relation, and transport the paper 20 to the paper stacker 33. The heat roller, pressure roller, and discharge rollers 29 and 30 are driven in rotation by a drive power transmitted via, for example, a gear train from a drive source (not shown).

The image forming apparatus 1 operates as follows:

The hopping roller 22 feeds the paper 20 into the transport path from the paper cassette 21 on a sheet-by-sheet basis. The paper 20 is held by a transport roller 25, a registry roller 26, and pinch rollers 23 and 24 in a sandwiched relation, and is transported into a transfer point defined between the photoconductive drum 11 of the process unit 10-1 and the transfer unit 27. As the photoconductive drum 11 rotates, the paper 20 is further transported through the transfer point so that the toner image on the photoconductive drum 11 is transferred onto the paper 20. Likewise, the paper 20 is transported through the remaining process units 10-2 to 10-4 so that the toner images of corresponding colors are transferred onto the paper 20 in registration.

When the paper 20 passes through the fixing unit 28, the toner images carried on the paper 20 are fixed. The paper 20 is further transported by the discharge rollers 29 and 30 and pinch rollers 31 and 32 to the paper stacker 33 defined on the outer wall of the image forming apparatus 1. This completes printing.

{Construction of Optical Print Head}

Figure 2:
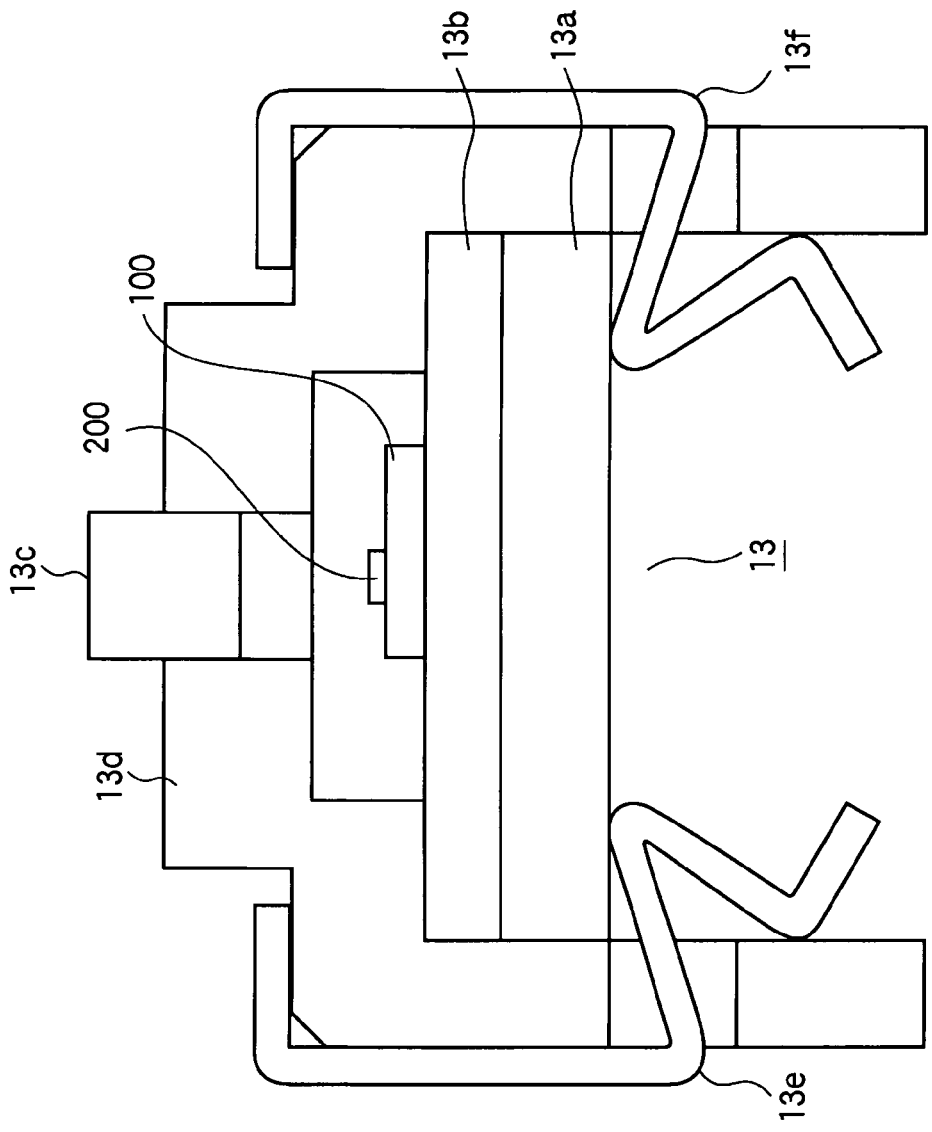
FIG. 2 is a cross-sectional view of the optical print head 13 shown in FIG. 1.

FIG. 2 is a cross-sectional view of the optical print head 13 shown in FIG. 1.

The optical print head 13 includes a base 13a and a printed wiring board 13b fixed on the base 13a. The printed wiring board 13b carries a plurality of driver circuits 100 (e.g., driver ICs at the bare chip level) mounted by means of, for example, thermosetting resin. A plurality of arrays 200 of light emitting elements (e.g., light emitting thyristors) are disposed on the driver ICs 100. A rod lens array 13c, which incorporates a plurality of columns of optical elements, is located over the driver ICs. The rod lens array 13c is fixedly supported by a holder 13d. Clamp members 13e and 13f firmly hold the base 13a, printed wiring board 13b, and holder 13d together.

{Head Circuit Board Unit}

Figure 3:
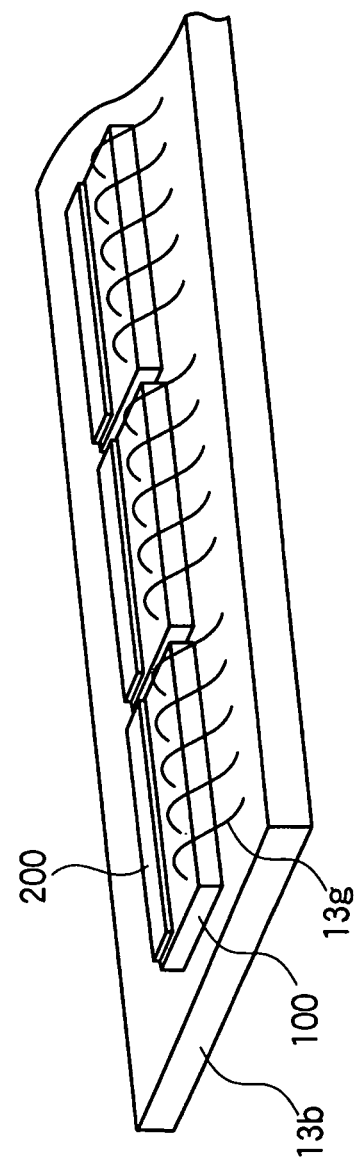
FIG. 3 is a perspective view of the head circuit board shown in FIG. 2.

FIG. 3 is a perspective view of the head circuit board shown in FIG. 2. The printed wiring board 13b carries thereon a plurality of light emitting thyristor arrays 200 at the bare chip level. The driver ICs 100 are electrically connected to the light emitting thyristors by means of thin film wirings. The driver ICs 100 and light emitting thyristor arrays 200 constitute a composite chip incorporating light emitting elements and driver elements. The respective terminals of the driver IC are connected by means of bonding wires 13g to wiring pads (not shown) formed on the print wiring board 13b.

{Printer Controller}

Figure 4:
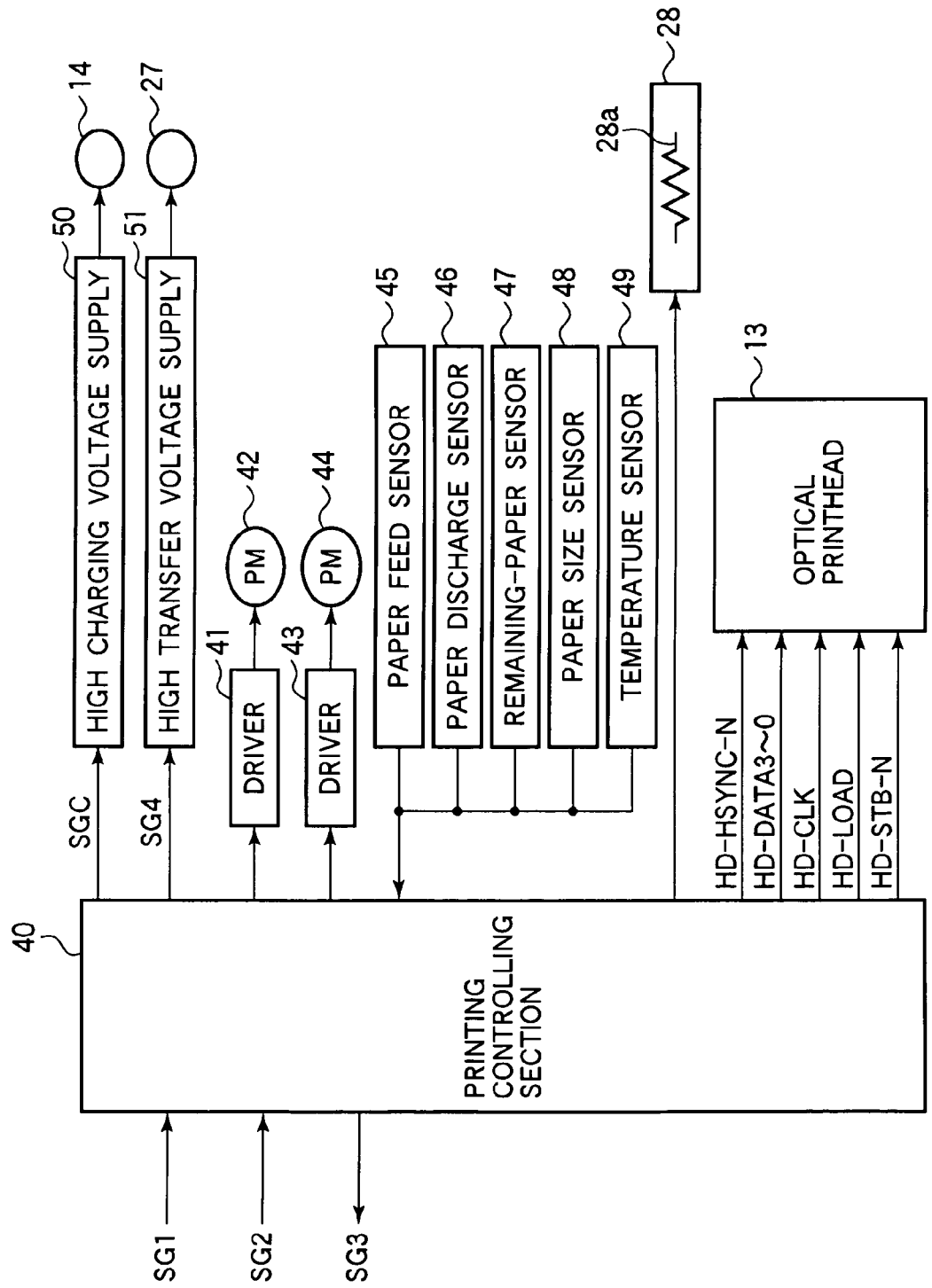
FIG. 4 is a block diagram illustrating the configuration of a printer controller for use with the image forming apparatus 1 shown in FIG. 1.

FIG. 4 is a block diagram illustrating the configuration of a printer controller for use with the image forming apparatus 1 shown in FIG. 1.

The printer controller includes a printing controller 40 located in a printing section of the image forming apparatus 1. The printing controller 40 mainly includes a microprocessor, a read only memory (ROM), a random access memory (RAM), an input/output port, and a timer. The printer controller receives a control signal SG1 and a video signal (bit map data arranged in a straight line) SG2 from an image processing section (not shown) to perform sequential control of the overall operation of the image forming apparatus 1, thereby performing printing. The printing controller 40 is connected to the four optical print heads 13 of the process units 10-1 to 10-4, a heater 28a of the fixing unit 28, drivers 41 and 43, an incoming paper sensor 45, an outgoing paper sensor 46, a remaining paper sensor 47, a paper size sensor 48, a fixing unit temperature sensor 49, a high voltage charging power supply 50, and a high voltage transferring power supply 51. The driver 41 is connected to a developing/transferring process motor (PM) 42. The driver 43 is connected to a paper transporting motor (PM) 44. The high voltage charging power supply 50 is connected to the developing unit 14. The high voltage transferring power supply 51 is connected to transfer units 27.

The printing controller operates as follows:

Upon reception of the control signals SG1 to command printing from the image processing section, the printing controller 40 determines by means of the temperature sensor 49 whether the heat roller in the fixing unit 28 is in a usable temperature range. If the temperature is not within the usable temperature range, the printing controller 40 supplies electric power to the heater 28a to heat the heat roller to the usable temperature. The printing controller 40 then causes the driver 41 to rotate the developing/transfer process motor 42, and outputs a charging signal SGC to turn on the high voltage charging power supply 50, thereby charging the developing unit 14.

Then, the remaining paper sensor 47 detects whether the paper 20 is present in the paper cassette and the paper size sensor 48 detects the size of the paper 20. Thus, the paper 20 of the right size is fed to the transport path. The paper transporting motor 44 is coupled to a planetary gear assembly and is adapted to rotate in the forward and reverse directions. Switching the rotation direction of the paper transporting motor 44 allows switching of the rotation directions of the transport rollers 25, depending on the size of the paper 20.

When printing on one page of paper is started, the paper transporting motor 44 is rotated in the reverse direction, thereby transporting the paper 20 by a predetermined amount until the incoming paper sensor 45 detects the paper 20. The paper transporting motor 44 is then rotated in the forward direction to transport the paper 20 into a print engine of the image forming apparatus 1.

When the paper 20 reaches a position where printing can be performed, the printing controller 40 provides a timing signal SG3 including a main scanning sync signal and a sub scanning sync signal to an image processing section (not shown), and receives the video signal SG2. The video signal SG2 is edited on a page-by-page basis in the image processing section and is received by the print controller 40. The video signal SG2 is transferred as print data signals HD-DATA3 to HD-DATA0 are supplied to the respective optical print heads 13. Each of the optical print heads 13 incorporates a plurality of light emitting thyristors, each thyristor forming a dot or pixel of an image.

Upon reception of the video signal SG2 for one line, the printing controller 40 provides the latch signal HD-LOAD to the respective optical print heads 13. In response to the latch signal HD-LOAD, the respective optical print heads 13 hold the print data signal HD-DATA. The printing controller 40 is adapted to perform printing of the print data signals HD-DATA3 to HD-DATA0 held in the respective print heads 13 while the printing controller 40 is receiving the next video signals SG2 from the image processing section.

The printing controller 40 provides the clock signal HD-CLK, a main scanning sync signal HD-HSYNC-N, and a print drive signal HD-STB-N to the respective optical print heads 13. The clock signal HD-CLK is used to send the print data signals HD-DATA3 to HD-DATA0 to the optical heads 13.

The video signal SG2 is transmitted and received on a line-by-line basis. The optical print head 13 illuminates the negatively charged surface of the photoconductive drum 11 to form an electrostatic latent image formed of dots having increased potential due to exposure to light. The toner is negatively charged in the developing unit 14 and is then attracted to the dots formed on the photoconductive drum 11 by the Coulomb force, thereby forming a toner image.

The toner image on the photoconductive drum 11 is then transported to the transfer point defined between the photoconductive drum 1 and the transfer unit 27. A transfer signal SG4 causes the high voltage transfer power supply 51 to turn on to apply a positive voltage, thereby transferring the toner image onto the paper 20 as the paper 20 passes through the transfer point defined between the photoconductive drum 11 and the transfer unit 27. The paper 20 carries the toner image thereon and passes through the fixing point defined between the heat roller and pressure roller of the fixing unit 28, so that the toner image is fixed under heat and pressure. The paper 20 is then further transported past the outgoing paper sensor 46.

In response to the detection signals from the paper size sensor 48 and incoming paper sensor 45, the printing controller 40 causes the high voltage transfer power supply 51 to turn on to apply the high voltage to the transfer unit 27 while the paper 20 is passing the transfer point defined between the photoconductive drum 11 and the transfer unit 27. When the paper 20 has passed the outgoing paper sensor 46 after completion of printing, the printing controller 40 causes the high voltage charging power supply 50 to stop applying the high voltage to the developing section 14, and the developing/transferring process motor 42 to stop rotating. The above-described operation is repeated until the entire print data has been printed.

{Circuit of Optical Print Head}

FIG. 5 illustrates the circuit configuration of the optical print head 13 shown in FIG. 4.

The optical print head 13 is capable of forming an electrostatic latent image on the photoconductive drum at a resolution of, for example, 600 dpi.

The optical print head 13 includes the printed wiring board 13b (FIG. 3) on which a plurality of driver ICs 100 (e.g., 26 driver ICs) are arranged. FIG. 5 shows only two driver ICs, i.e., driver ICs 100-1 and 100-2 and corresponding light emitting thyristor arrays 200-1 and 200-2 arranged on the driver ICs. Each driver IC drives a corresponding light emitting thyristor array. A total of 4992 light emitting thyristors are employed to form an electrostatic latent image having a total of 4992 dots. Each thyristor array includes a total of 192 light emitting thyristors 211-1 to 211-96 and 212-1 to 212-96 whose cathodes are connected to the ground terminal GND. The anodes of adjacent thyristors (e.g., thyristors 211-1 and 212-2) are connected together to a corresponding one of the drive current output terminals DO1 to DO96 of the driver IC 100 by means of their film wirings.

A total of 26 driver ICs 100 are of an identical configuration, and are cascaded.

Data input terminals DATAI3 to DATAI0 receive print data signals HD-DATA3 to HD-DATA0. A latch signal terminal LOAD receives a latch signal HD-LOAD. A CLK terminal receives a clock signal HD-CLK. A VREF terminal receives a reference voltage VREF. An STB terminal receives the print drive signal HD-STB-N, which serves as a strobe signal. A VDD terminal receives a power supply voltage VDD. The ground terminal GND is connected to the ground. A HSYNC terminal receives the main scanning sync signal HD-HSYNC-N. Output data terminals DATAO3 to DATAO0 output the data to the next stage driver IC. The drive current output terminals DO1-DO96 supply drive currents to the anodes of the light emitting thyristors 210 in the light emitting thyristor arrays. A gate drive signal terminal G1 outputs a gate drive signals that drives the gates of odd-numbered light emitting thyristors 210 through a common wire 220a. A gate drive signal terminal G2 outputs a gate drive signal that drives the gates of even-numbered light emitting thyristors 210 through a common wire 220b.

The reference voltage VREF is a reference voltage relative to which the drive currents for driving the light emitting thyristors are set. The reference voltage VREF is output from a reference voltage generating circuit (not shown) in the optical print head 13. When the light emitting thyristors are driven in a time-division manner, the main scanning sync signal HD-HSYNC-N is a sync signal that indicates whether the odd-numbered light emitting thyristors should be driven or the even-numbered light emitting thyristors should be driven.

{Operation of Optical Print Head}

The operation of the optical print head 13 of the above-described configuration shown in FIG. 5 will be described. The print data signals HD-DATA3 to HD-DATA0 are outputted simultaneously on the clock signals HD-CLK, and drive adjacent four light emitting thyristors for 4 pixels. For this operation, the print controller 40 shown in FIG. 4 outputs the print data signals HD-DATA3 to HD-DATA0 to the data input terminals DATAI3 to DATA0 of the first driver IC 100-1, and the clock signals HD-CLK to the CLK terminals of all the driver ICs 100-1 to 100-26. The print data signals HD-DATA3 to HD-DATA0 are shifter through the driver ICs on the clock signal. The print data is bit data for a total of 4992 bits (i.e., 4992 dots): 2496 odd-numbered bits and 2496 even-numbered bits. The bit data for the odd-numbered dots is first shifted through shift registers implemented with flip-flops in the driver ICs, and then the bit data for the even-numbered dots is shifted through the same shift registers.

Next, the latch signal HD-LOAD is inputted to the latch signal terminals LOAD of all the driver ICs 100, so that the bit data in the shift register is latched to the latch circuit in the form of flip-flops (FFs). The High levels of the bit data latched in the latch circuit drive the light emitting thyristors 210, which are connected to the drive current output terminals DO1, DO2, . . . terminals, to turn on upon the print drive signal HD-STB-N.

Referring to FIG. 5, the optical print head 13 incorporates a large number of light emitting thyristor arrays 200. Therefore, the variation of characteristics of the light emitting thyristors due to manufacturing errors cause variations of light output among the arrays of light emitting thyristors and also among light emitting thyristors in the same array. This causes dots on the photoconductive drum to be formed by different amount of energy.

This phenomenon causes the variations of dot size during development of a toner image, leading to uneven print density. In order to solve the problem, the drive currents flowing through the respective light emitting thyristors are usually adjusted so that all the light emitting thyristors output a substantially equal amount of light. The driver ICs 100 shown in FIG. 5 incorporate such a drive current adjusting circuit, which will be described later.

{Light Emitting Thyristor}

FIGS. 6A-6D illustrate the structures of the light emitting thyristor 210 shown in FIG. 5.

FIG. 6A illustrates the symbol of the thyristor.

FIG. 6B is a cross-sectional view of the thyristor.

FIG. 6C is a cross-sectional view of another structure of the light emitting thyristor.

FIG. 6D is an equivalent circuit of the thyristors shown in FIGS. 6B and 6C.

Referring to FIG. 6A, the light emitting thyristor 210 includes an anode A, a cathode K, and a gate G.

Referring to FIG. 6B, the light emitting thyristor 210 is fabricated by epitaxially growing a predetermined crystal on a GaAs wafer by known metal organic chemical vapor deposition (MO-CVD).

First, a predetermined sacrificial layer and a buffer layer (not shown) are grown epitaxially. A wafer of a three-layer structure is then fabricated. The three-layer structure includes an N-type layer 213 that contains an N-type impurity, a P-type layer 212 that contains a P-type impurity, and an N-type layer 211 that contains an N-type impurity, in this order. A P-type impurity region 214 is selectively formed in the uppermost N-type layer 211 by photolithography.

Grooves are formed in the wafer to define individual devices by dry etching. When dry etching is performed, a part of the N-type layer 213, which is the lowermost layer of the light emitting thyristor 210, is etched to expose. A metal wiring is formed on the exposed region to form a cathode K. The P-type impurity region 214 and N-type layer 211 are also formed as an anode A and a gate G, respectively.

The light emitting thyristor 210 shown in FIG. 6C is fabricated by epitaxially growing a predetermined crystal on a GaAs wafer by MO-CVD.

First, a predetermined sacrificial layer and a buffer layer (not shown) are exitaxially grown. A wafer of a PNPN four-layer structure is then fabricated. The four-layer structure includes an N-type layer 213 that contains an N-type impurity, a P-type layer 212 that contains a p-type impurity, an N-type layer 211 that contains an N-type impurity, and a P-type layer 215 that contains a P-type impurity in this order.

Grooves are formed in the wafer to define individual devices by dry etching. When dry etching is performed, a part of the N-type 213, which is the lowest layer of the light emitting thyristor 210, is exposed. Likewise, a part of the P-type layer 215, which is the uppermost layer, is exposed. A metal wiring is formed on the exposed region of the P-type layer 215 to form the anode A. At the same time, the gate G is formed on the N-type layer 211.

As is clear from FIG. 6D, the light emitting thyristor 210 is constituted of a PNP transistor 221 and an NPN transistor 222. The emitter of the PNP transistor 221 corresponds to the anode A of the light emitting thyristors 210 and the base of the PNP transistor 221 corresponds to the gate G. The gate G is also connected to the collector of the NPN transistor 222. The collector of the PNP transistor 221 is connected to the base of the NPN transistor 222. The emitter of the PNPN transistor 222 corresponds to the cathode K of the thyristor 210.

The light emitting thyristor 210 shown in FIGS. 7A-7D has an AlGaAs layer formed on a GaAs wafer. The thyristor 210 is not limited to this configuration. The thyristor 210 may have a layer of GaP, GaAsP, or AlGaInP formed on the GaAs wafer or a GaN or AlGaN layer formed on a sapphire substrate.

The thyristor 210 shown in FIGS. 6B and 6C may be bonded by epitaxially bonding to a wafer on which a plurality of driver ICs 100 shown in FIG. 5 are arranged, and then unnecessary portions are removed from the wafer by a known etching technique to expose portions to be formed into terminals of the light emitting thyristor 210. The film wirings are formed by photolithography to connect the terminals of the driver IC 100 to the terminal areas of the light emitting thyristor 210. The wafer is then diced into individual chips of driver ICs by a known dicing technique, thereby obtaining composite chips that include light emitting thyristors and driver elements.

{Overall Configuration of Driver ICs}

Figure 7:
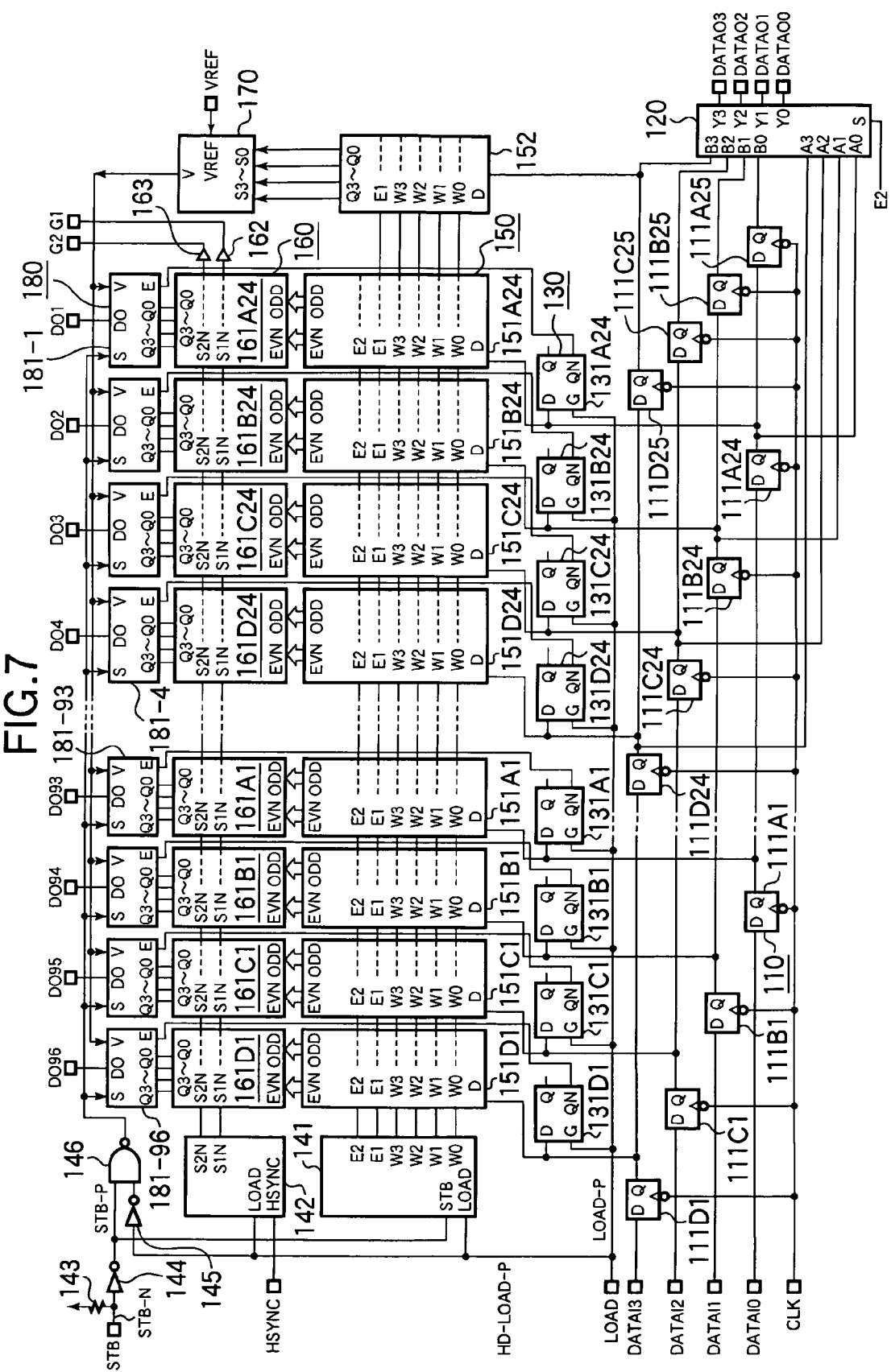
FIG. 7 is a block diagram illustrating the details of one of the driver ICs 100-1, 100-2, ... 100-26 shown in FIG. 5.

FIG. 7 is a block diagram illustrating the details of one of the driver ICs 100-1, 100-2, . . . 100-26 shown in FIG. 5.

Each driver IC 100 includes a shift register 110 constituted of a plurality of cascaded flip flops FFs 111A1-111A25, FFs 111B1-111B25, FFs 111C1-111C25, and FFs 111D1-111D25. The shift register 110 receives the print data signals HD-DATA3 to HD-DATA0 at the data input terminals DATAI3 to DATAI0 on the clock signals HD-CLK received at the clock terminal CLK, while also shifting the print data on the clock CLK.

The flip flops FFs 111A1-111A25 are cascaded and shift the data received at the data input terminal DATAI0. The data input terminal DATAI0 of the driver IC 100 is connected to the data input terminal D of the flip flop FF 111A1. The data output terminals Q of the flip flops FFs 111A24 and 111A25 are connected to the data input terminals A0 and B0 of a shift-stage selector 120, respectively. The output terminal Y0 of the shift-stage selector 120 is connected to a data output terminal DATAO0 of the driver IC 100. Likewise, the flip flops FFs 111B1-111B25, FFs 111C1-111C25, and FFs 111D1-111D25 are also cascaded. Data input terminals DATAI1, DATAI2, and DATAI3 are connected to the data input terminals D of the flip flops FFs 111B1, 111C1, and 111D1. The output terminals Q of the FF111B24 and FF111B25 are connected to input terminals A1 and B1 of the shift-stage selector 120, respectively. The output terminals Q of the FF111C24 and FF111C25 are connected to input terminals A2 and B2 of the shift-stage selector 120, respectively. The output terminals Q of the flip flops FFs 111D24 and 111D25 are connected to input terminals A3 and B3 of the shift-stage selector 120, respectively. The output terminals Y1, Y2, and Y3 of the shift-stage selector 120 are connected to data output terminals DATAO1, DATAO2, and DATAO3 of the driver IC 100, respectively.

Thus, the flip flops FFs 111A-111A25, FFs 111B1-111B25, FFs 111C1-111C25, and FFs 111D1-111D25 constitute the 25-stage shift register 110. The shift-stage selector 120 enables switching of the shift register 110 between a 24-stage shift register mode and a 25-stage shift register mode. The data output terminals DATAO0 to DATAO3 of each driver IC 100 are connected to the data input terminals DATAIO to DATAIO3 of the next driver IC 100 (FIG. 5). The above-described shift register 110 is a part of the shift register constituted of a total of 26 driver ICs 100-1 to 100-26. Thus, for example, the print data signal HD-DATA3 is shifted either in the 24×26 stage shift register mode or in the 25×26 stage shift register mode, and is finally loaded to a driver 181-1 after completion of shifting.

The outputs of the shift register 110 are connected to the inputs of a latch circuit 130 and a memory circuit 150. The outputs of the latch circuit 130 are connected to a driver section 180. A memory controller 141 is connected to the input of the memory circuit 150 whose outputs are connected to a multiplexer 160. A signal selector 142 is connected to the inputs of the multiplexer 160. The drive terminal STB of the driver IC 100 is connected to a pull-up resistor 143 and an inverter 144. An inverter 145 is connected to the latch signal terminal LOAD of the driver IC 100. The output terminals of the inverters 144 and 145 are connected to the input terminals of a 2-input NAND gate 146 whose output terminal is connected to inputs of the driver section 180. Control voltage receiving terminals V of the driver section 180 are connected to a control voltage generator 170.

The latch circuit 130 latches the output signals of the shift register 110 on the latch signal LOAD-P ("P" denotes positive logic) received at the latch signal terminal LOAD. The latch circuit 130 includes a plurality of sub latching elements 131A1-131A24, 131B1-131B24, 131C1-131C24, and 131D1-131D24. Each sub latching element has a data input terminal D, a latch signal input terminal G, and an inverted data output terminal QN. The inverted data output terminals QN of the latching elements are connected to the driver section 180.

The memory circuit 150 is controlled by the memory controller 141, and stores correction data for correcting the variations of the light emitting thyristors. (i.e., dot correction data), correction data for correcting the variations of the light output of each of the respective light emitting thyristor arrays 200 (i.e., chip correction data), or data unique to each of the respective drivers IC 100. The memory circuit 150 includes a plurality of sub memory circuits 151A1-151A24, 151B1-151B24, 151C1-151C24, and 151D1-151D24 and a sub memory circuit 152. The outputs of the sub memory circuits 151A1-151A24, 151B1-151324, 151C1-151C24, and 151D1-151D24 are connected to the multiplexer 160 and the outputs of the sub memory circuit 152 are output to the control voltage generator 170. The sub memory circuits 151A1-151A24, 151B1-151B24, 151C1-151C24, and 151D1-151D24 each have a data input terminal D, memory cell selecting terminals W0-W3, write-enable signal input terminals E1 and E2, and data output terminals EVN and ODD. The sub memory circuit 152 has data input terminal D, memory cell selecting terminals W0-W3, a write-enable signal input terminal E1, and data output terminals Q0-Q3. The outputs of the memory circuit 150 are connected to the multiplexer 160 and the control voltage generator 170.

The memory controller 141, which controls the memory circuit 150, has a latch signal terminal LOAD, a drive signal input terminal STB, memory cell selecting signal terminals W0-W3, write-enable signal output terminals E1 and E2. The memory controller 141 outputs memory cell selecting signal from the memory cell selecting signal terminals W0-W3 and write-enable signal from the write-enable signal input terminals E1 and E2 to the plurality of sub memory circuits 151A1-151A24, 151B1-151B24, 151C1-151C24, and 151D1-151D24, and the sub memory circuit 152.

The multiplexer 160 is controlled by the signal selector 142 to select either the correction data for the odd-numbered dots or the correction data for the even-numbered dots, the correction data being outputted from the plurality of sub memory circuits 151A-151A24, 151B1-151B24, 151C1-151C24, and 151D1-151D24. The multiplexer 160 includes a plurality of sub multiplexers 161A1-161A24, 16131-161B24, 161C1-161C24, and 161D1-161D24, each sub multiplexer having data input terminals EVN and ODD, selection signal terminals S1N and S2N, data output terminals Q0-Q3. The data output terminals Q0-Q3 of the sub multiplexers are connected to the driver 180.

The signal selector 142, which controls the multiplexer 160, has the main scanning synch signal HSYNC terminal, latch signal terminal LOAD, and first and second selection signal terminals S1N and S2N. The signal selector 142 outputs a selection signal from the first selection signal terminal S1N to select the correction data for the odd-numbered and a selection signal from the second selection signal terminal S2N to select the correction data for the even-numbered dots. The first selection signal terminal S1N is connected to the gate drive signal terminal G1 via a first gate driver 162 and the selection signal output terminal S2N is connected to gate drive signal terminal G2 via a second gate driver 163.

The control voltage generator 170 is connected to the inputs of the driver section 180, and has data input terminals S0-S3, a reference voltage input terminal VREF, and a control voltage output terminal V. The control voltage generator 170 receives the reference voltage VREF generated by, for example, a regulator circuit (not shown), and generates a control voltage Vcont for driving the light emitting thyristors. The control voltage V is supplied to the driver section 180. The control voltage generator 170 maintains the reference voltage VREF at a constant value even if the supply voltage VDD may momentarily drop such as when all of the LEDs are turned on. Thus, the thyristor drive current may be kept unchanged.

The driver section 180 outputs drive currents through the drive current output terminals DO01-DO96 for driving the light emitting thyristor arrays 200-1, 200-2, . . . , 200-26, the drive currents being generated in accordance with the outputs of the latch circuit 130, NAND gate 146, multiplexer 160, and control voltage generator 170. The driver section 180 includes drivers 181-1 to 181-96, each driver including data input terminals Q0-Q3, a terminal E, signal input terminal S, and a control voltage input terminal V.

The NAND gate 146 is connected to the signal input terminals S of the driver section 180, receives the print drive signal HD-STB-N and the latch signal LOAD-P through the inverters 144 and 145, and then outputs a control signal that makes the driver section 180 on or off.

{Sub Memory Circuits}

Each of the sub memory circuits 151A1-151A24, 151B1-151B24, 151C1-151C24, and 151D1-151D24 in the driver IC 100 shown in FIG. 7 may be substantially identical.

Figure 8:
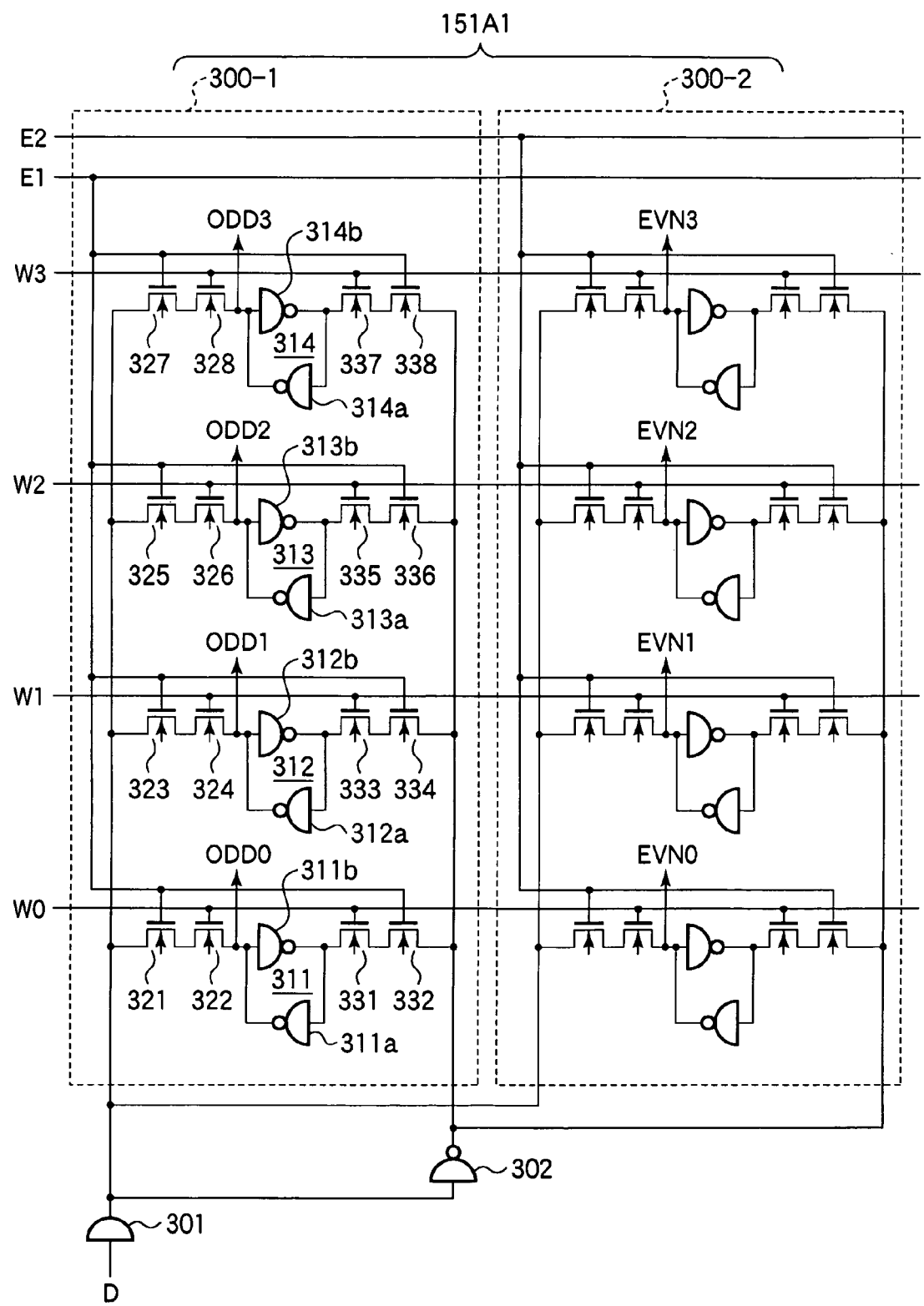
FIG. 8 is a schematic diagram illustrating, by way of example, the configuration of the sub memory circuit shown in FIG. 7.

FIG. 8 is a schematic diagram illustrating, by way of example, the configuration of the sub memory circuit 151A1 shown in FIG. 7.

The sub memory circuit, for example, 151A1 shown in FIG. 8 holds 4-bit dot correction data for odd and even numbered dots which can adjust the drive current for a light emitting thyristor in 16 levels, thereby correcting the light output of the light emitting thyristor.

The sub memory circuit 151A1 includes two adjacent, identical memory cell groups 300-1 and 300-2. The memory cell group 300-1 (e.g., dot #1) holds correction data for an odd-numbered dot and the memory cell 300-2 (e.g., dot #2) holds correction data for an even-numbered dot. Each memory cell group includes 4 memory cells, e.g., 311-314, that hold the 4-bit dot correction data for correcting the light output of the light emitting thyristor. The 4-bit dot correction data is capable of setting the thyristor drive current in 16 increments for each dot. Each of the memory cell groups 300-1 and 300-2 may be substantially identical; for simplicity only the memory cell group 300-1 will be described, it being understood that the memory cell group 300-2 may work in a similar fashion.

The correction data terminal D of the sub memory circuit 151A1 receives the correction data from the output terminal Q of the flip flop FF 111A1 of the shift register 110. A write-enable signal output terminal E1 receives a write-enable signal, which is outputted from the write-enable signal output terminal E1 of the memory controller 141 and enables writing of the data for odd-numbered dots. Another write-enable signal output terminal E2 receives another write-enable signal, which is outputted from the write-enable signal output terminal E2 of the memory controller 141 and enables writing of the data for even-numbered dots. The memory cell selecting terminals W0-W3 receive memory cell selecting signals from the memory cell selecting terminals W0-W3 of the memory controller 141. The terminals ODD0-ODD3 output the correction data for odd-numbered dots. The terminals EVN0-EVEN3 output the correction data for the even-numbered dots.

The correction data terminal D is connected to the memory cell group 300-1 via a buffer 301. The output of the buffer 301 is connected to the input of an inverter 302 which in turn produces an inverted correction data, i.e., a logic inversion of the correction data.

The memory cell group 300-1 includes memory means (e.g., cells) 311 to 314, data switching means (NMOS transistor switches 321 to 328), and another data switching means (NMOS transistor switches 331 to 338).

The memory cell 311 includes first and second inverters 311a and 311b cascaded to form a ring circuit. In other words, the first inverter has a first output terminal and a first input terminal, and the second inverter having a second output terminal and a second input terminal. The first output terminal is connected to the second input and the second output is connected to the first input terminal. Likewise, the memory cell 312 includes inverters 312a and 312b cascaded to form a ring. The memory cell 313 includes inverters 313a and 313b to form a ring. The memory cell 314 includes inverters 314a and 314b to form a ring. The supply terminals of the inverters 311a, 311b, 312a, 312b, 313a, 313b, 314a, and 314b are connected to the supply terminal VDD to which power supply voltage VDD, e.g., 5 V, is applied.

The gates of NMOS transistors 321, 323, 325, and 327 are connected to the enable signal terminal E1 while the gates of NMOS transistors 322, 324, 326, and 328 are connected to the memory cell selecting terminals W0, W1, W2, and W3, respectively. The output terminal of the buffer 301 is connected to a series circuit of the NMOS transistors 321 and 322, correction data terminal ODD0, and the memory cell 311; a series circuit of NMOS transistors 323 and 324, correction data terminal ODD1, and the memory cell 312; a series circuit of NMOS transistors 325 and 326, correction data terminal ODD2, and the memory cell 313; and a series circuit of NMOS transistors 327 and 328, correction data terminal ODD3, and the memory cell 314.

The gates of NMOS transistors 331, 333, 335, and 337 are connected to the memory cell selecting terminals W0-W3 and the gates of NMOS transistors 332, 334, 336, and 338 are connected to the enable signal terminal E1. The output of the inverter 302 is connected to a series circuit of the NMOS transistors 332 and 331 and the memory cell 311, a series circuit of the NMOS transistors 334 and 333 and the memory cell 312, a series circuit of the NMOS transistors 336 and 335 and the memory cell 313, and a series circuit of the NMOS transistors 338 and 337 and the memory cell 314.

The memory cell group 300-2 is of the same configuration as the memory cell group 300-1 except that the memory cell group 300-2 is connected to the write-enable signal terminal E2 and correction data terminals EVN0-EVN3.

{Multiplexer}

Figure 9:
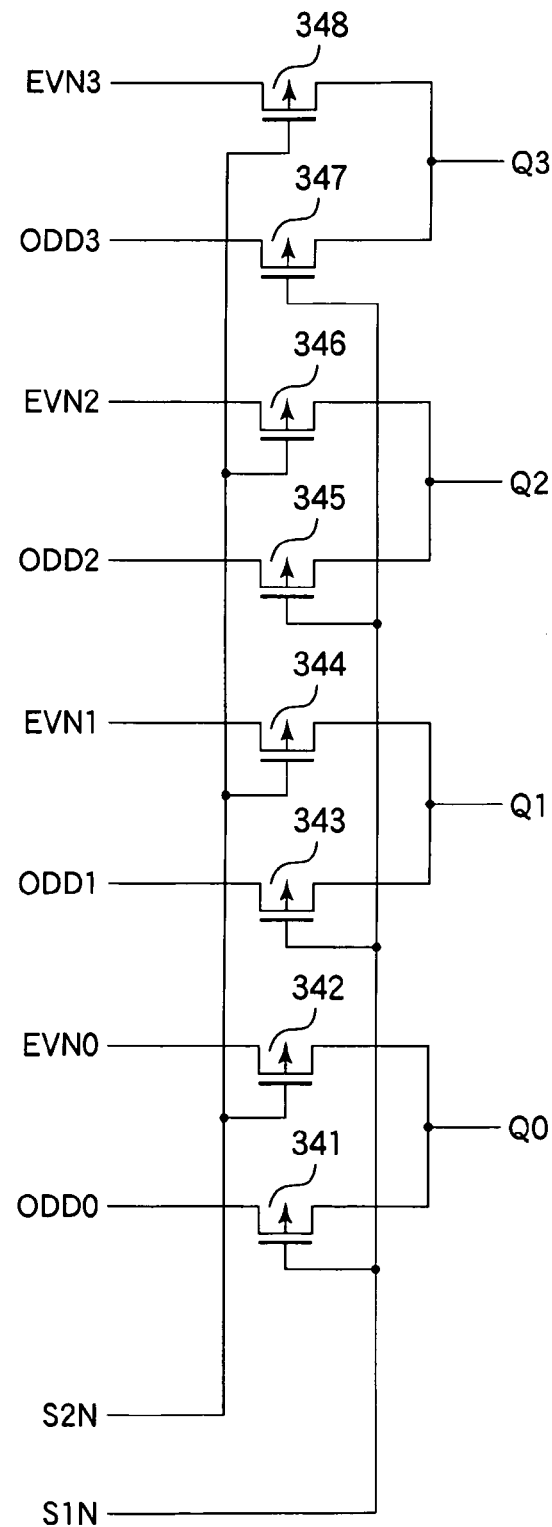
FIG. 9 illustrates the configuration of the multiplexer 161 shown in FIG. 7.

FIG. 9 illustrates the configuration of the multiplexer 161 shown in FIG. 7.

Referring to FIG. 9, the correction data terminals ODD0-ODD3 of, for example, the sub multiplexer 161A1 receive the correction data from the correction data terminals ODD0-ODD3 of the sub memory circuit 151A1. The correction data terminals EVN0-EVN3 of the sub multiplexer 161A1 receive the correction data from the correction data terminals EVN0-EVN3 of the sub memory circuit 151A1. The selection signal terminals S1N and S2N of the multiplexer 161A1 receive selection signals from the selection signal terminals S1N and S2N of the signal selector 142. Correction data terminals Q0-Q3 output correction data. P channel MOS transistors (referred to as PMOS transistor hereinafter) 341-348 select input data.

PMOS transistors 341, 343, 345, and 347 are controlled to turn on or off by the selection signal S1N, thereby connecting the correction data terminals ODD0-ODD3 to the correction data terminals Q0-Q3 or disconnecting the correction data terminals ODD0-ODD3 from the correction data terminals Q0-Q3. The PMOS transistors 342, 344, 346, and 348 are controlled to turn on or off by the selection signal S2N applied to their gates, thereby connecting the correction data terminals EVN0-EVN3 to the correction data terminals Q0-Q3 or disconnecting the correction data terminals EVN0-EVN3 from the correction data terminals Q0-Q3.

The multiplexer 161A of the above-described configuration employs the PMOS transistors 341-348 as switch elements. The use of the PMOS transistors 341-348 enables a reduction of the number of parts while ensuring reliable operation of the multiplexer 161A.

When the selection signal S1N is set to low ("Low" level) to turn on the PMOS transistor 341, if the correction data ODD0 is at the High level, the correction data Q0 has a substantially equal voltage to the High level of the correction data ODD0. In other words, the PMOS transistor 341 can be used to transfer a signal of the High level without any problem.

However, if the correction data ODD0 is at the Low level, the potential of the drain of the PMOS transistor 341 decreases close to the threshold voltage of the PMOS transistor 341 but not low enough to become the Low level (nearly 0 volts). Thus, the PMOS transistor 341 presents a problem in transferring a signal of the Low level.

In order to solve the above described drawbacks, a conventional art switching means employs, for example, an analog switch which is a parallel connection of a PMOS transistor and an NMOS transistor. This configuration permits generating an output voltage substantially equal to an input voltage and the insertion of a switch means does not cause any difference between the input voltage and output voltage. However, this configuration necessitates the parallel connection of the PMOS transistor and NMOS transistor for each data line, requiring twice as many components as the configuration shown in FIG. 9. This requires a larger chip area of the IC to accommodate the components.

The configuration of the invention shown in FIG. 9 requires one half as many components as the conventional art that employs analog switches, but presents a problem in transferring a signal of the Low level. However, it is to be noted that a signal of the High level input into the driver 181 connected to the outputs of the multiplexer 161 is required to be substantially equal to the power supply voltage VDD and a signal of the Low level needs only to be as low as the control voltage Vcont which will be described later. In other words, the Low level input to the driver 181 does not need to be substantially 0 volts. For this reasons, the multiplexer shown in FIG. 9 is effective in reducing the number of components while eliminating constraints in the circuit operation.

{Driver}

Figure 10:
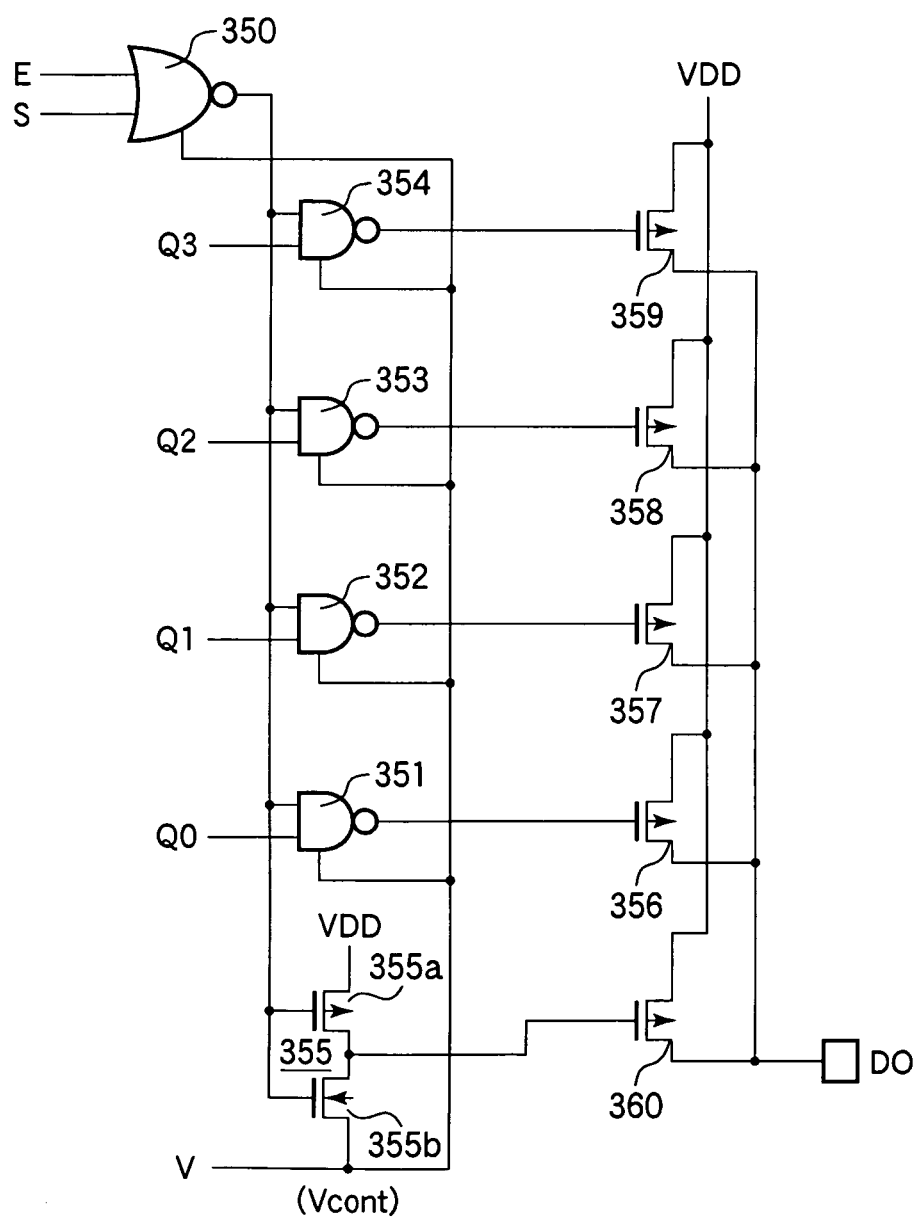
FIG. 10 is a schematic diagram of the driver shown in FIG. 7.

FIG. 10 is a schematic diagram of the driver 181 shown in FIG. 7.

Referring to FIG. 10, a print data terminal E of the driver 181 (e.g., 181-93) receives print data (negative logic) from an inverted output terminal QN of the latch 131A1. A control terminal S receives a negative logic drive signal for driving a light emitting thyristor from the NAND gate 146. The correction data terminals Q0-Q3 receive the correction data from the correction data terminals Q0-Q3 of the multiplexer 161A1. A control voltage receiving terminal V receives a control voltage Vcont from the control voltage output terminal V of the control voltage generator 170. The VDD terminal receives the supply voltage VDD. A drive current output terminal DO (i.e., DO93) outputs the drive current to the anode of a corresponding light emitting thyristor via a thin film wiring (not shown).

The print data terminal E and control terminal S are connected to the input terminals of a 2-input NOR gate 350. The NOR gate 350 has a supply terminal connected to the supply terminal VDD and a ground terminal to which the control voltage Vcont is applied. The output terminal of the NOR gate 350 and the correction data terminals Q0-Q3 are connected to the input terminals of 2-input NAND gates 351-354, respectively. The 2-input NAND gates 351-354 have their supply terminals connected to the VDD terminal and ground terminals connected to the control voltage receiving terminal V to which the control voltage Vcont is applied. The output terminals of the NOR gate 350 is connected to the gates of PMOS transistors 355a and NMOS 355b that constitute a complementary symmetry MOS inverter (CMOS inverter). The PMOS transistor 355a and NMOS transistor 355b are connected in series between the VDD terminal and the control voltage receiving terminal V.

The output terminals of the NAND gates 351-354 are connected to the gates of the PMOS transistors 356-359. The gate of the PMOS transistor 360 is connected to the output terminal of the CMOS inverter 355. The sources and drains of the PMOS transistors 356-360 are connected in parallel between the VDD terminal and drive current output terminal DO. The PMOS transistor 360 is a main drive transistor that supplies a large portion of the light emitting thyristor drive current and the PMOS transistors 356-359 are auxiliary transistors that adjust a small portion of the light emitting thyristor drive current for each dot, thereby correcting the light output of the light emitting thyristor.

The difference between the voltage (potential) at the VDD terminal and the control voltage Vcont at the control voltage receiving terminal V is substantially equal to the gate-source voltage when the PMOS transistors 356-360 are turned on. Varying the gate-to-source voltage allows adjustment of the drain current of the PMOS transistors 356-360. The control voltage generator 170 shown in FIG. 7, which supplies the control voltage Vcont, controls the control voltage Vcont based on the reference voltage VREF so that the drain currents through the PMOS transistors 356-360 have their corrected values.

The driver 181-93 of the aforementioned configuration operates as follows.

When the print data received at the print data terminal E is ON (Low level or "L") and the control signal received at the control terminal S is ON (Low level or "L"), the output of the NOR gate 350 is at the High level. At this moment, the outputs of the NAND gates 351-354 and the output of the CMOS inverter 355 becomes equal to the supply voltage VDD or Vcont in response to the data at the correction data terminals Q3-Q0.

The PMOS transistor 360 is controlled by the print data inputted to the print data terminal E. The correction data is outputted from the sub memory circuit 151A1 (FIG. 8) to the correction data terminals Q0-Q3 of the multiplexer 161A1. When the output of the NOR gate 350 goes high, the PMOS transistors 356-359 are selectively driven in accordance with the correction data that appears at the correction data terminals Q0-Q3.

In other words, when the PMOS transistor 360 is driven, the PMOS transistors 356-359 are also selectively driven, so that the light emitting thyristor drive current is the sum of the drain current flowing through the PMOS transistor 360 and the drain currents flowing through the PMOS transistors 356-359, and is supplied to the corresponding light emitting thyristor from the drive current output terminal DO.

When the PMOS transistors 356-359 are driven, the outputs of the NAND gates 351-354 are low (Low level) (=approximately Vcont), so that the gate voltage of the PMOS transistors 356-359 are nearly equal to the control voltage Vcont. At this moment, the PMOS transistor 355a is OFF and the NMOS 355b is ON so that the gate voltage of the PMOS transistor 360 is also nearly equal to the control voltage Vcont. This implies that the drain currents flowing through the PMOS transistors 356-360 can be driven by the single control voltage Vcont. At this moment, the NAND gates 351-354 receive the supply voltage VDD at its supply terminal and the control voltage Vcont at its ground terminal. The input signal can have a voltage between the supply voltage VDD and the control voltage Vcont, and therefore the LOW level need not be 0 volts.

{Memory Controller}

Figure 11:
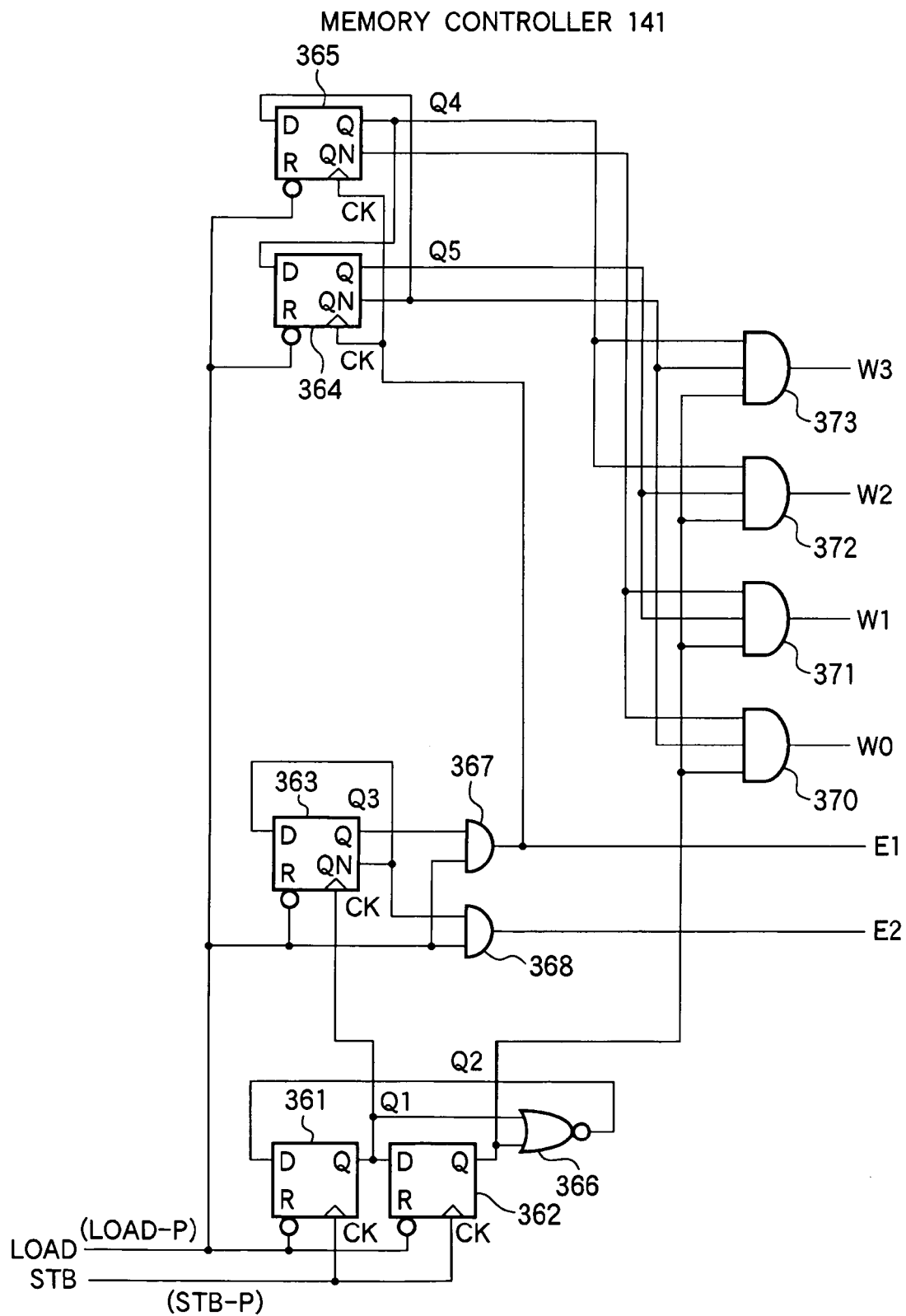
FIG. 11 is a schematic diagram illustrating the configuration of the memory controller shown in FIG. 7.

FIG. 11 is a schematic diagram illustrating the configuration of the memory controller 141 shown in FIG. 7.

The latch signal terminal LOAD receives the positive logic latch signal LOAD-P. The drive terminal STB receives a positive logic print drive signal STB-P outputted from the inverter 144 shown in FIG. 7. The memory cell selecting terminals W0-W3 output the memory selecting signal to the memory circuit 150 shown in FIG. 7. The write-enable signal terminals E1 and E2 output the write enable signals to the memory circuit 150. The memory controller 141 also includes flip flops FFs 361-365, 2-input NOR gate 366, 2-input AND gates 367 and 368, and 3-input AND gates 370-373.

The flip-flops FFs 361 and 362 include a negative logic reset terminal R, a clock signal terminal CK, a data input terminal D, and a non-inverted output terminal Q. The reset terminal R receives the latch signal LOAD-P from the latch signal terminal LOAD. The CLK terminal receives the positive logic signal print drive signal STB-P from the drive terminal STB. The output terminal Q outputs the data. Each of the flip-flops FFs 363-365 has a negative logic reset terminal R for receiving the latch signal LOAD-P from the latch signal terminal LOAD. Each of the flip-flops FFs 363-365 also has a clock terminal CK, a data input terminal D, a non-inverted output terminal Q, and an inverted output terminal QN.

The non-inverted output terminals Q of the flip flops FFs 361 and 362 are connected to the inputs of the NOR gate 366. The output of the NOR gate 366 is connected to the input terminal D of the flip flop FF 361. The non-inverted output terminal Q of the flip flop FF 361 is fed to the clock terminal CK of the flip flop FF 363 whose output QN is connected to the input terminal D of the flip flop FF 363. The output terminal Q of the flip flop FF 363 and the latch signal terminal LOAD are connected to the inputs of the AND gate 367 whose output is connected to the write enable signal terminal E1. The output QN of the flip flop FF 363 and the latch signal terminal LOAD are connected to the inputs of the AND gate 368 whose output is connected to the write-enable signal terminal E2.

The output of the AND gate 367 is connected to the clock terminals CK of the flip flops FFs 364 and 365. The negative logic reset terminals R of the flip flops FFs 364 and 365 are connected to the latch signal terminal LOAD. The inverted output terminal QN of the flip flop FF 364 is connected to the input terminal D of the flip flop FF 365. The non-inverted output terminals Q and inverted output terminal QN of the flip flops FFs 364 and 365 and the non-inverted output terminal Q of the flip flop FF 362 are connected to the input terminals of the AND gates 370-373. The outputs of the AND gates 370-373 are connected to the memory cell selecting terminals W0-W3, respectively.

The first input terminal and the second input terminal of the AND gate 373 are connected to the non-inverted output terminal Q of the flip flop FF 365 and the inverted output terminal QN of the flip flop FF 364, respectively. The first input terminal and second input terminal of the AND 372 are connected to the non-inverted output terminal Q of the flip flop FF 364 and the output terminal Q of the flip flop FF 365, respectively. The first input terminal and the second input terminal of the AND gate 371 are connected to the inverted output terminal QN of the flip flop FF 365 and the non-inverted output terminal Q of the flip flop FF 364, respectively. The first input terminal and the second input terminal of the AND gate 370 are connected to the inverted output terminal QN of the flip flop FF 365 and the inverted output terminal QN of the flip flop FF 364, respectively.

{Signal Selector}

Figure 12:
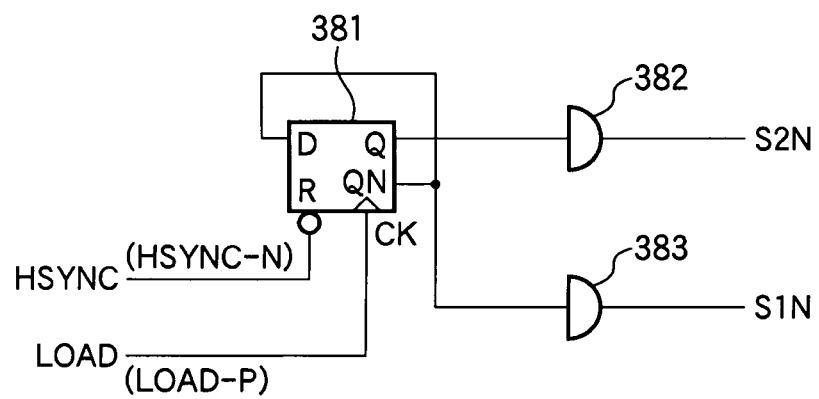
FIG. 12 a schematic diagram illustrating the configuration of the signal selector shown in FIG. 7.

FIG. 12 a schematic diagram illustrating the configuration of the signal selector 142 shown in FIG. 7.

The signal selector 142 has a flip flop FF 381 and buffers 382 and 383. The reset terminal R (negative logic) of the flip flop FF 381 receives the main scanning sync signal HSYNC-N from the sync signal terminal HSYNC of the driver IC 100. A clock terminal CK receives the latch signal LOAD-P (positive logic) from the latch signal terminal LOAD. An input terminal D is connected to an inverted-output terminal QN. A non-inverted output terminal Q outputs a non-inverted output. The signals appearing on the output terminals Q and QN are fed to the selection signal terminals S2N and S1N through the buffers 382 and 383, respectively.

The signal selector 142 is configured to output the selection signals of either the "H" level or the "L" level to the selection signal terminals S1N and S2N in synchronism with the latch signals LOAD-P received at the latch signal terminal LOAD.

{Control Voltage Generator}

Figure 13:
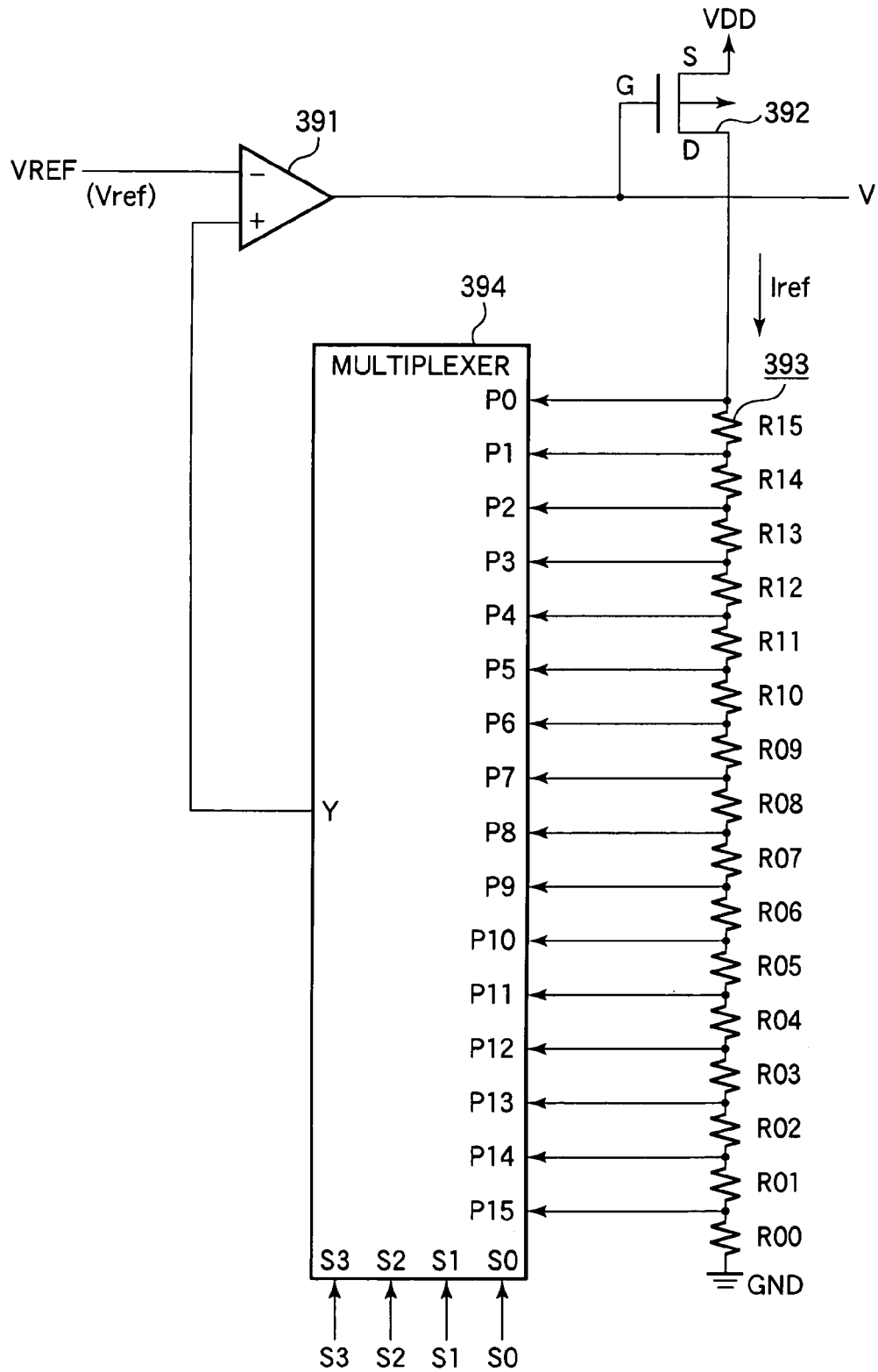
FIG. 13 illustrates the configuration of the control voltage generator shown in FIG. 7.

FIG. 13 illustrates the configuration of the control voltage generator 170 shown in FIG. 7.

Each driver IC 100 includes the corresponding control voltage generator 170. The control voltage generator 170 includes an operational amplifier 391, a PMOS transistor 392, a voltage divider 393 including series-connected resistors R00-R15, and an analog multiplexer 394.

The operational amplifier 391 has an inverted input terminal connected to the VREF terminal, a non-inverted input terminal connected to the output terminal Y of the multiplexer 394, and an output terminal connected to the control voltage output terminal V and the gate of the PMOS transistor 392. The PMOS transistor 392 has the same gate length as the PMOS transistors 356-360 shown in FIG. 10. The PMOS transistor 392 has a source connected to the VDD terminal, a gate connected to the output terminal of the operational amplifier 391 and the control voltage output terminal V, and a drain connected to the ground terminal GND through the voltage divider 393.

The multiplexer 394 includes 16 input terminals P0-P15 that receive analog voltages from junction points of the voltage dividing resistors R15-R00 connected in series, and input terminals S0-S3 that receive logic signals from the output terminals Q0-Q3 of the sub memory circuit 152 shown in FIG. 7. The four logic signals are used to produce 16 different logic combinations for selecting one of the input terminals P0-P15, thereby outputting a corresponding analog voltage from the output terminal Y to the non-inverted input terminal of the operational amplifier 391. In other words, one of the input terminals P0-P15 is selected in accordance with the logic levels at the input terminals S3-S0 of the multiplexer 394, thereby establishing a current path between the output terminal Y and the selected one of the input terminals P0-P15.

The OP amp 391, voltage divider resistors R00-R15, and PMOS transistor 392 constitute a feedback control circuit which maintains the voltage at the non-inverted input terminal of the OP amp 391 substantially equal to the reference voltage VREF. For this reason, the drain current Iref of the PMOS transistor 392 is determined by the resultant resistance of those voltage divider resistors R00-R15 selected by the multiplexer 394 and the reference voltage VREF inputted to the OP amp 391.

For example, when the input terminals S3-S0 of the multiplexer 394 are at logic levels "1," "1," "1," and "1" (i.e., maximum value), respectively, the input terminal P15 is connected to the output terminal Y so that the voltage at the input terminal P15 is substantially the same as the reference VREF. Consequently, the drain current Iref of the PMOS transistor 392 is given as follows:

$$Iref=VREF/R00$$

On the other hand, the logic levels at the terminals S3-S0 are "0," "1," "1," and "1" (i.e., medium value), the input terminal P7 is connected to the output terminal Y so that the voltage at the input terminal P7 is substantially the same as the reference voltage VREF. Consequently, the drain current Iref of the PMOS transistor 392 is given as follows:

$$Iref=VREF/(R00+R01+R02+R03+R04+R05+R06+R07+R08)$$

When the logic levels at the terminals S3-S0 are "0000" (i.e., minimum value), the input terminal P0 of the multiplexer 394 is connected to the output terminal Y of the multiplexer 394 so that the drain current Iref of the PMOS transistor 402 is given as follows:

$$Iref=VREF/(R00+R01+R02\ldots+R15)$$

The PMOS transistors 356-360 shown in FIG. 10 and the PMOS transistor 392 shown in FIG. 13 have the same gate length and are driven to operate in their saturation regions, and so one of the PMOS transistors constitutes a current mirror of the other. When the PMOS transistors 356-360 become ON, the drain current Iref is proportional to the reference voltage VREF. Therefore, the drain current Iref can be adjusted in 16 increments by selectively setting the logic levels at the input terminals S3-S0 of the multiplexer 394. Thus, the drain currents through the PMOS transistors 356-360 can also be adjusted in 16 increments.

{Gate Driver}

FIGS. 14A and 14B illustrate the configuration of the first and second gate drivers 162 and 163 shown in FIG. 7. FIG. 14A illustrates the circuit symbol of the gate drivers 162 and 163. FIG. 14B is a circuit schematic of the gate drivers 162 and 163.

The first gate driver 162 and second gate driver 163 are substantially identical in configuration. The first gate driver 162 has an input terminal IN connected to the selection signal terminal S1N of the signal selector 142. An inverter 401 has an input terminal connected to the input terminal IN and an output node N401 connected to the input terminal of an inverter 402 and the input terminal of a timing adjusting circuit 405. The timing adjusting circuit 405 takes the form of an analog switch implemented with a parallel connection of an NMOS transistor 405a and a PMOS transistor 405b. The output node N405 of the timing adjusting circuit 405 is connected to the gate of a first switch element, e.g., PMOS transistor 403. The gate of the NMOS transistor 405a is connected to the VDD terminal and the gate of the PMOS transistor 405b is connected to the ground GND.

The source of the PMOS transistor 403 is connected to the VDD terminal. The drain of the PMOS transistor 403 is connected to the source of a voltage level shifter or a PMOS transistor 406. The gate and drain of the PMOS transistor 406 are connected to the output terminal OUT. The output terminal OUT is connected to the ground GND through the source-drain of a second switch element, e.g. PMOS transistor 404. The gate of the PMOS transistor 404 is connected to an output node N402 of the inverter 402.

Figure 15:
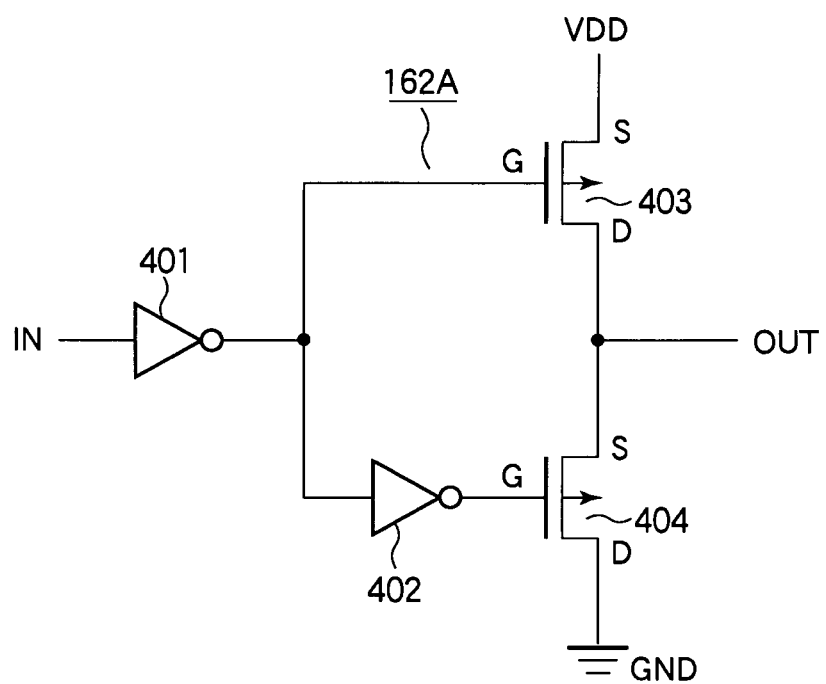
FIG. 15 illustrates a gate driver 162A as a comparative example.

FIG. 15 illustrates a gate driver 162A as a comparative example.

The gate driver 162A does not include the timing adjusting circuit 405 and the PMOS transistor 406 (FIG. 14B). The output terminal of the inverter 401 is connected to the gate of the PMOS transistor 403. The drain of the PMOS transistor 403 is connected to the output terminal OUT.

When the input terminal IN of the gate driver 162A goes high ("High" level), the output terminal of the inverter 401 goes low ("Low" level), and the output terminal of the inverter 402 goes high ("High" level). Thus, the PMOS transistor 403 becomes ON and the PMOS transistor 404 becomes OFF, causing the output terminal OUT to rise to a voltage substantially equal to the power supply voltage VDD.

In contrast, the gate driver 162 of the present invention (FIG. 14B) employs the timing adjusting circuit 405.

The timing adjusting circuit 405 serves to delay the signal by a substantially equal amount of time to the delay time of the inverter 402, so that the PMOS transistor 403 turns on substantially at the same time that the PMOS transistor 404 turns off, and so that the PMOS transistor 403 turns off substantially at the same time that the PMOS transistor 404 turns on. This prevents malfunction of the circuit due to a crowbar current that would otherwise flow from the VDD terminal to the ground GND through the PMOS transistors 403, 406, and 404.

In other words, if the timing adjusting circuit 405 is not employed, both the PMOS transistor 403 and PMOS transistor 404 may be turned on substantially simultaneously for a short period of time equal to the delay time of the inverter 402. This causes a crowbar current between the VDD terminal and the ground GND, resulting in a high noise voltage in VDD terminal or the ground wirings and hence malfunction of the internal circuit of the driver IC 100. The gate drivers 162 and 163 of the present invention employ the timing adjusting circuits 405 to prevent the driver IC 100 from malfunctioning.

The timing adjusting circuit 405 of the first embodiment takes the form of an analog switch but may be another form of switch. For example, the timing adjusting circuit 405 may be constituted of an even number of inverters. If crowbar current is not critical to the circuit operation, the output node N401 of the inverter 401 may be directly connected to the gate of the PMOS transistor 403 instead of employing the timing adjusting circuit 405.

{Overall Operation of Optical Print Head}

Figure 16:
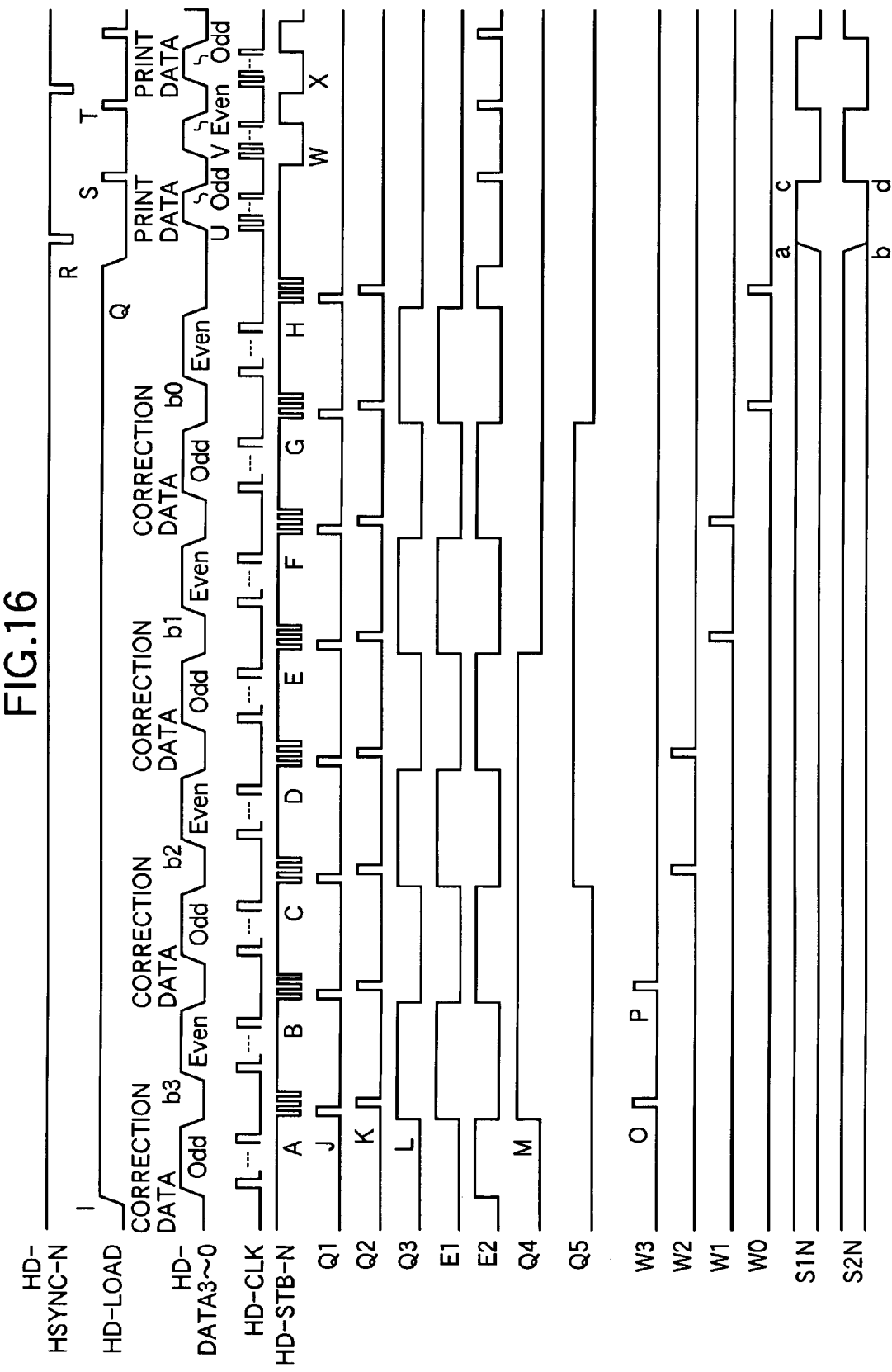
FIG. 16 is a timing chart illustrating the transferring of the correction data performed in the optical print head 13 after power-up of the image forming apparatus 1 of the first embodiment.

FIG. 16 is a timing chart illustrating the transferring of the correction data performed in the optical print head 13 after power-up of the image forming apparatus 1 of the first embodiment.

Prior to the transferring of the correction data, the latch signal HD-LOAD is set to the High level indicating that the correction data will follow (portion I).

The correction data for one dot is 4-bit data. The data for bit 3, by way of example, of the correction data for an odd-numbered dot is inputted from the print data signals HD-DATA3 to HD-DATA0 into the shift register 110 constituted of the flip flops FF 111A1 to FF 111D24 (FIG. 7), while being shifted by one position upon each clock signal HD-CLK. Upon completion of shifting, three consecutive pulses of the print drive signal HD-STB-N are inputted as depicted at portion A, enabling the memory controller 141 shown in FIG. 11 to operate.

The signals Q1, Q2, Q3, Q4, and Q5 shown in FIG. 16 are signals that appear on the output terminals of the flip flops FFs 361, 362, 363, 365, and 364 shown in FIG. 11, respectively. The write-enable signal terminals E1 and E2 are connected to the outputs of the AND gates 367 and 368. The memory cell selecting terminals W3-W0 are connected to the outputs of the AND gates 373, 372, 371, and 370. The selection signal terminals S1N and S2N are connected to the output terminals of the buffers 383 and 382 shown in FIG. 12, respectively.

When the first pulse of the print drive signal HD-STB-N is received as depicted at portion "A," the signal Q1 appears (portion J). When the second pulse of the print drive signal HD-STB-N is received, the signal Q2 appears (portion K). The signal Q3 appearing on the output terminal of the flip flop FF 363 turns each time the signal Q1 appears. For example, the signal Q3 goes high at the first signal at the output terminal Q1 as illustrated in FIG. 16, and goes low at the second signal at the output terminal Q1. The signals at the output terminals QN and Q3 of the flip flop FF 363 are fed to the AND gates 367 and 368, respectively, the AND gates 367 and 368 outputting the write-enable signals E1 and E2.

The signal at the Q4 terminal rises as depicted at portion M on the rising edge of the write-enable signal E1. The signal at the Q5 terminal rises on the next rising edge of the write-enable signal E1. The signal at the Q4 terminal falls on the still next rising edge of the write-enable signal E1. The signal at the Q5 terminal falls on the further next rising edge of the write-enable signal E1.

The memory cell selecting signals W3-W0 are generated in order, each having two consecutive pulses (e.g., portions O and P) are generated on the rising edge of the signal on the Q2 terminal.

Data is written into the memory circuit 151 shown in FIG. 8 on the two pulses of the writes signals W3-W0, the data for odd-numbered dots being written on the first pulse into the memory cells 311-314 in the memory cell group 300-1 and the data for even-numbered dots being written on the second pulse into the memory cells in the memory cell group 300-2.

The first pulses (e.g., portion Q) of the memory selecting signals W3-W0 are clocked by the print drive signal HD-STB-N at portions A, C, E, and G and the second pulses (e.g., portion P) of the memory selecting signals W3-W0 are clocked by the print drive signals HD-STB-N at portions B, D, F, and H.

Once all of the correction data for bit3-bit0 (ODD3-ODD0 and EVN3-EVN0) have been written into the memory cell groups 300-1 and 300-2, the latch signal HD-LOAD is set to the Low level as depicted at portion Q, allowing the print data signals HD-DATA3 to HD-DATA0 to be transferred to the multiplexer 161. The main scanning sync signal HD-HSYNC-N as depicted at portion R is input into the driver IC 100, indicating that the data for the odd numbered dots will be transferred prior to printing of one line.

The print data signals HD-DATA3 to HD-DATA0 for the odd-numbered dots are shifted through the shift register 110, i.e., through the flip-flops FF 111A1 to FF 111D1, . . . FF 111A24 to FF 111D24 as depicted at portion U, and are then latched into the latch circuit 130 on the latch signal HD-LOAD at portion S.

The print drive signal HD-STB-N then goes low (Low level) as depicted at portion W, thereby causing the light emitting thyristors 211-1, 211-2, . . . 211-96 and 212-1, 212-2, . . . 212-96 (FIG. 5) to emit light. The light emitting thyristors 211-1, 211-2, . . . 211-96 and 212-1, 212-2, . . . 212-96 continue to emit light as long as the print drive signal HD-STB-N remains at a low level as depicted at portion W and portion X.

Likewise, the print data signals HD-DATA3 to HD-DATA0 for the even numbered dots are shifted through the shift register 110 at portion V.

As shown in FIG. 7, the selection signal S1N outputted from the signal selector 142 is fed to the first gate driver 162 (FIG. 14B), which in turn outputs the gate drive signal G1 to the odd-numbered light emitting thyristors 212 through the common wiring 220a. The selection signals S2N outputted from the signal selector 142 is fed to the second gate driver 163 (FIG. 14B), which in turn outputs the gate drive signal G2 to the even-numbered light emitting thyristors 211 through a common wiring 220b.

{Details of Transfer of Correction Data}

FIGS. 17-20 are timing charts illustrating waveforms of the respective signals using one of the driver ICs 100-1, 100-2, . . . , 100-26.

Figure 17:
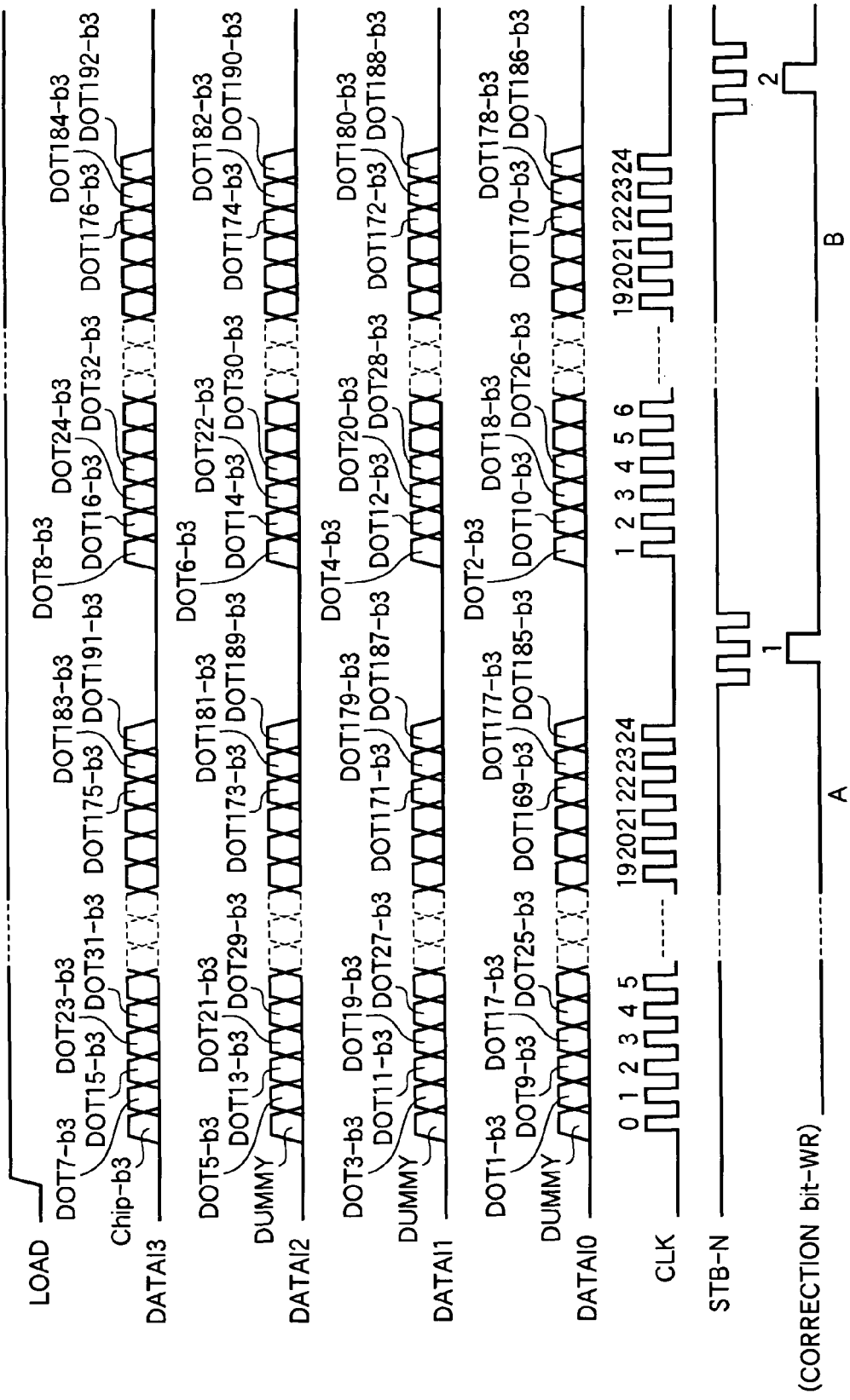
FIG. 17 illustrates the details of portions A and B shown in FIG. 16.
Figure 18:
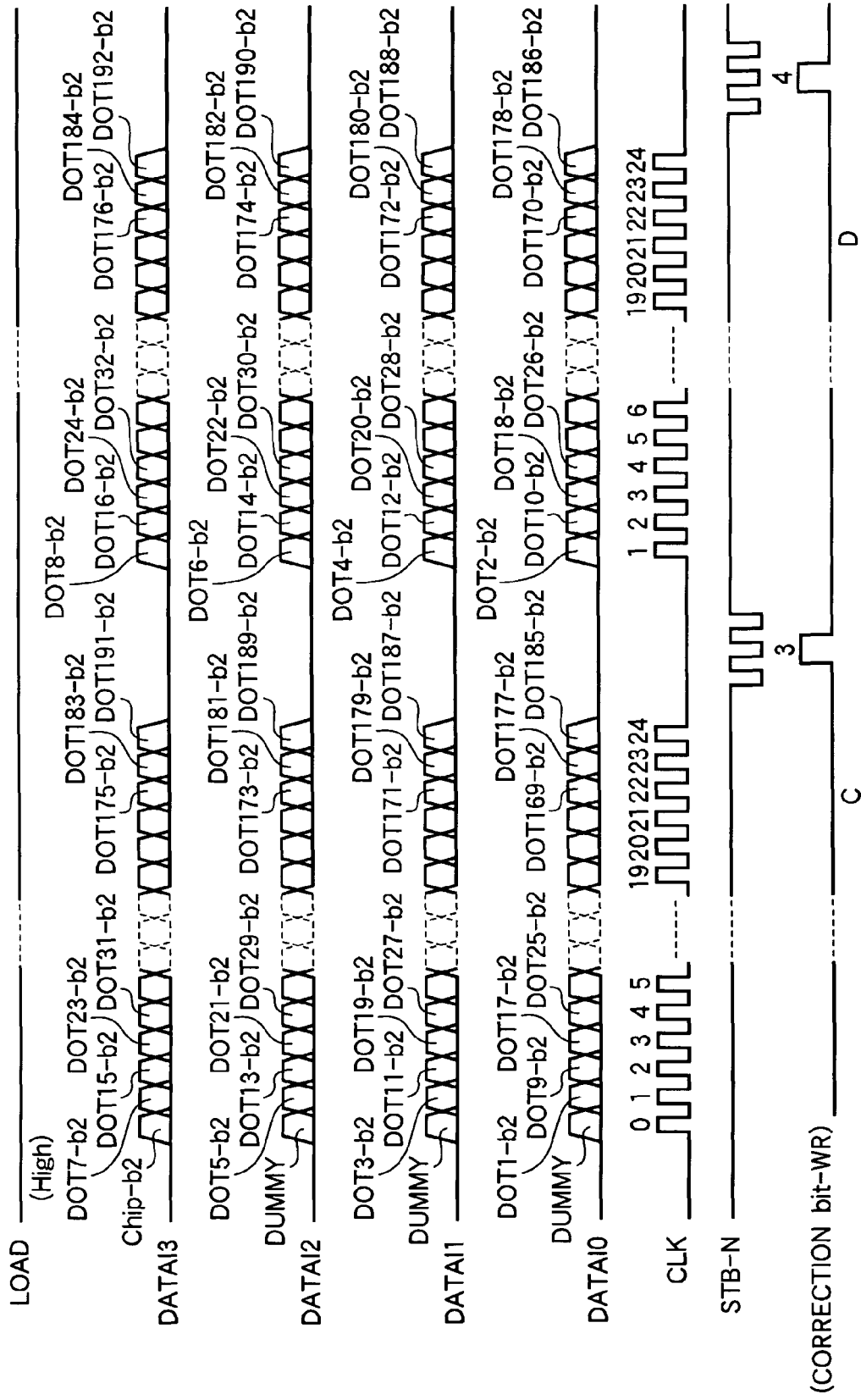
FIG. 18 illustrates the details of portions C and D shown in FIG. 16.
Figure 19:
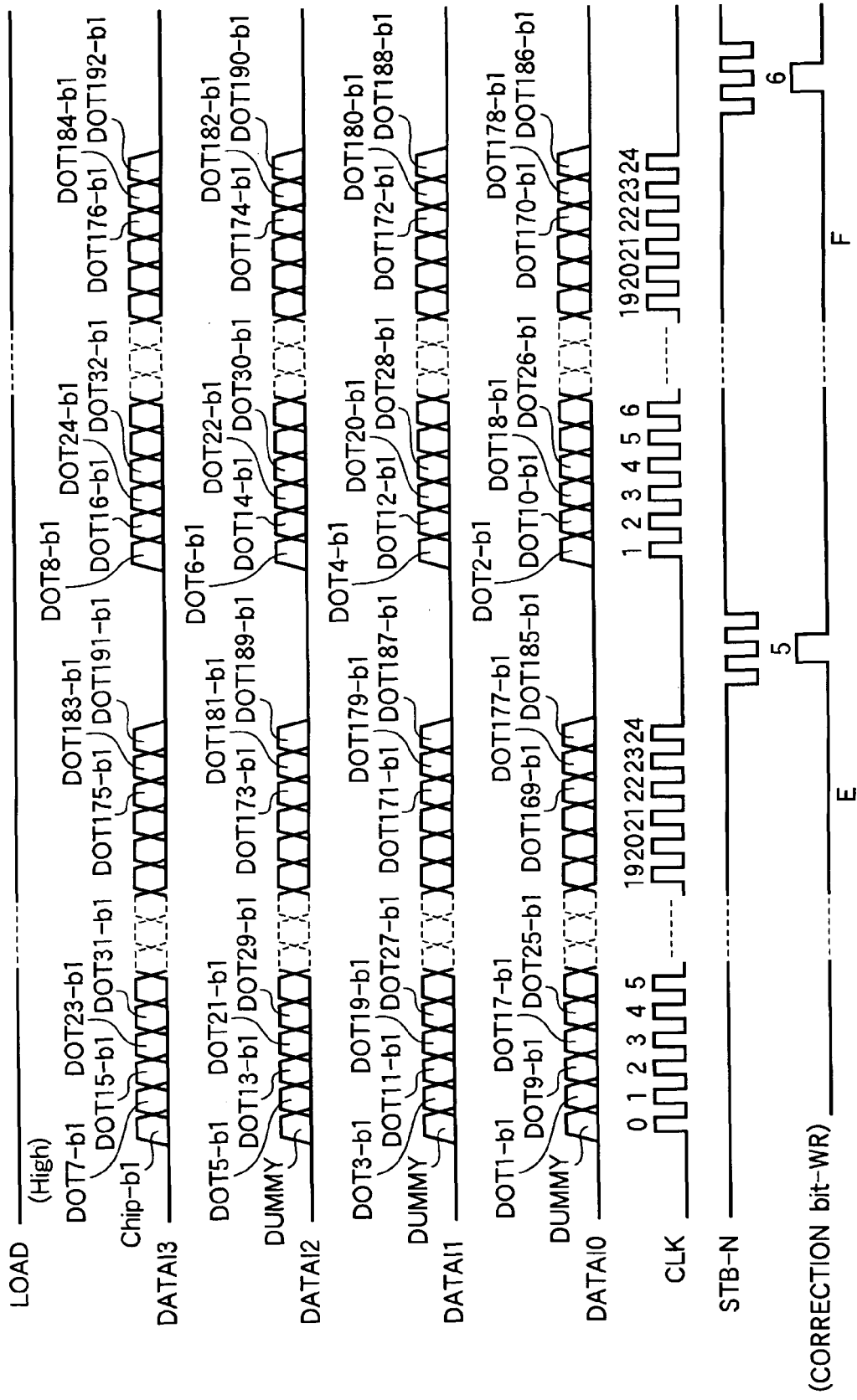
FIG. 19 illustrates the details of portions E and F shown in FIG. 16.
Figure 20:
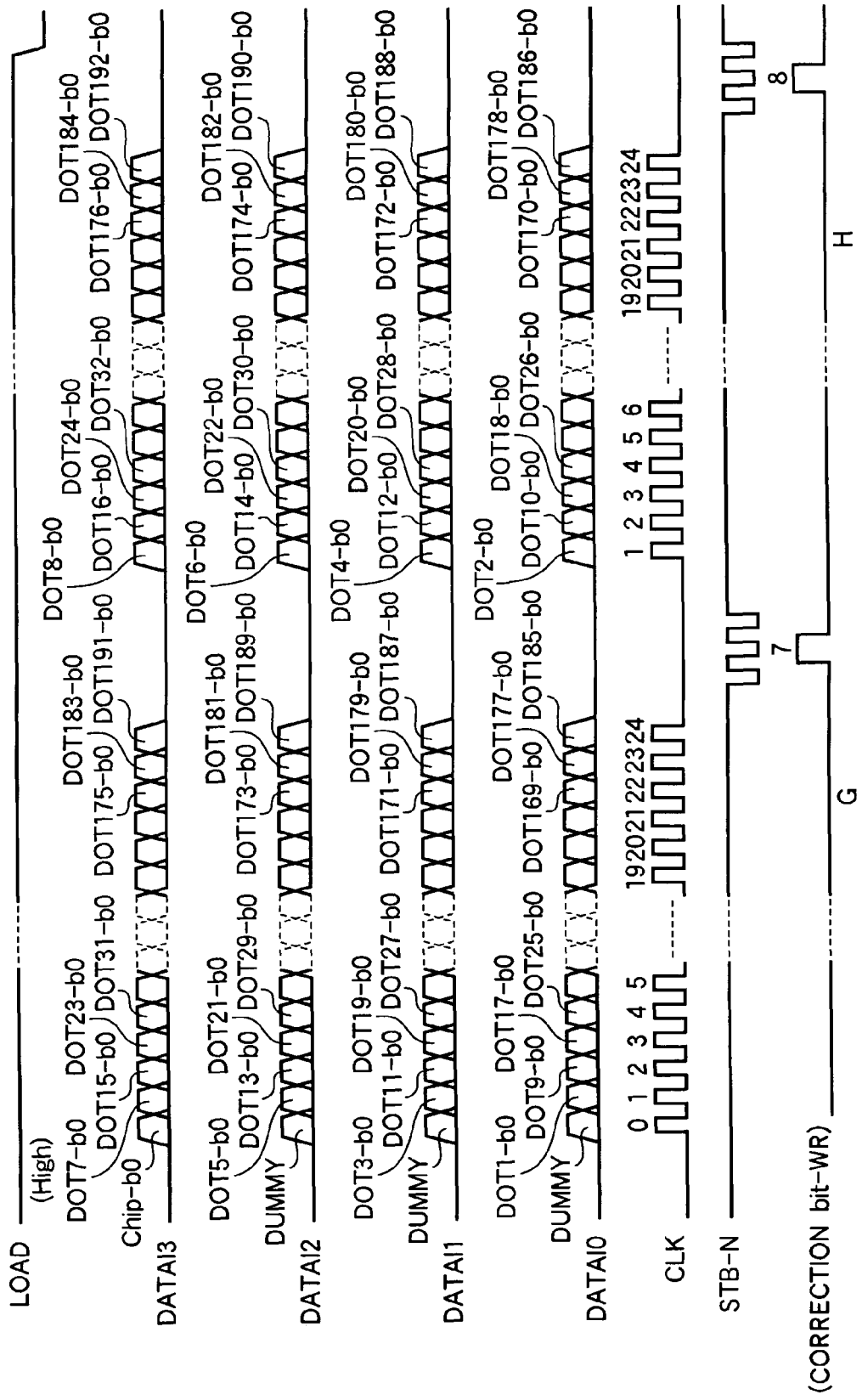
FIG. 20 illustrates the details of portions G and H.

FIG. 17 illustrates the details of portions A and B shown in FIG. 16. FIG. 18 illustrates the details of portions C and D shown in FIG. 16. FIG. 19 illustrates the details of portions E and F shown in FIG. 16. FIG. 20 illustrates the details of portions G and H.

Referring to FIG. 16, the chip correction data chip-b3, chip-b2, chip-b1, and chip-b0 to be set for each driver IC 100 need to be transferred only for either odd-numbered dots (e.g., portion "A") or even-numbered dots (e.g., portion "B").

For this purpose, the shift register 110 shown in FIGS. 17-20 has one more stage when the correction data for the odd-numbered dots (portions A, C, E, G, etc.) is shifted than when the correction data for the even-numbered dots is shifted. The chip correction data is added to the top of the string of data when the data is outputted from the printing controller 40.

{Operation of Gate Drivers}

Figure 21A:
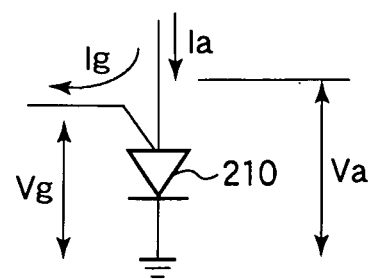
FIGS. 21A and 21B illustrate the first and second gate drivers 162 and 163 shown in FIG. 7 for driving the gates of the light emitting thyristor.
Figure 21B:
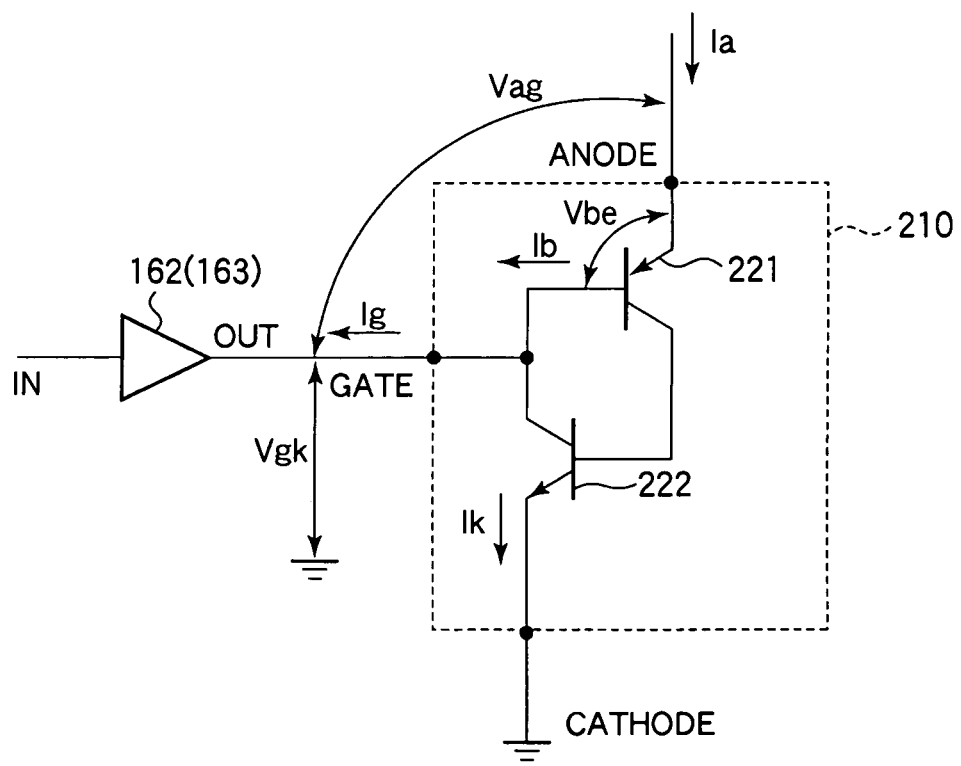

FIGS. 21A and 21B illustrate the first and second gate drivers 162 and 163 shown in FIG. 7 for driving the gates of the light emitting thyristor 210. FIG. 21A illustrates the symbol of the light emitting thyristor 210 and the voltage and current at the respective terminals. FIG. 21B is an equivalent circuit of the light emitting thyristor 210 connected to the first gate driver 162, the light emitting thyristor 210 being constituted of the PNP transistor 221 and the NPN transistor 222.

The operation of the light emitting thyristor 210 will be described. Assume that the input of the gate driver 162 (or 163) is at the Low level. The output node N401 of the inverter 401 in the gate driver 162 is at the High level. Since the timing adjusting circuit 405 is in the ON state at all times, the output node N405 of the timing adjusting circuit 405 is also at the High level so that the PMOS 403 is OFF.

The output node N402 of the inverter 402 of the first gate driver 162 is at the Low level, so that the PMOS transistor 404 in ON to bring the voltage at the output terminal OUT to the Low level. The voltage at the output terminal OUT is equal to the gate-source voltage Vgs of the PMOS transistor 404, and will decrease to a final value, i.e., the threshold voltage Vt of the PMOS transistor 404.

In order to drive the light emitting thyristor 210, the drive current output terminal DO of the driver IC 100 shown in FIG. 5 outputs an anode current Ia. The anode current Ia is a forward current that flows through a PN junction (i.e., base-to-emitter of the PNP transistor 221) to cause a gate current Ig. This causes an anode voltage Va to appear across the anode and cathode of the light emitting thyristor 210. The gate voltage at this moment is Vgs.

The gate current Ig is a part of the base current Ib of the PNP transistor 221, resulting in the collector current through the PNP transistor 221. The collector current flows as the base current into the NPN transistor 222 causing the NPN transistor 222 to conduct. The collector current of the PNP transistor 221 causes the base current of the PNP transistor 221 to further increase, accelerating the transition of the PNP transistor from the OFF state to the ON state.

After the NPN transistor 222 has turned on completely, the collector-emitter voltage of the NPN transistor 222 is lower than the threshold Vt of the PMOS 404 of the first gate driver 162 shown in FIG. 14B. As a result, the gate current Ig, which would otherwise flow from the gate of the light emitting thyristor 210 shown in FIGS. 21A and 21B to the output terminal OUT, is nearly zero, and a cathode current Ik substantially equal to the anode current Ia flows so that the light thyristor 210 becomes ON completely.

Figure 21C:
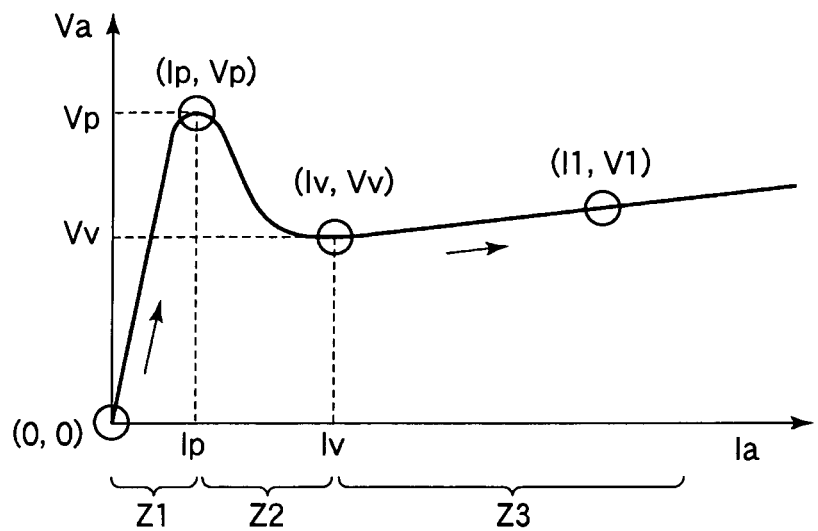
FIG. 21C illustrates changes in the gate current drawn to the same scale of the gate current Ig.
Figure 21D:
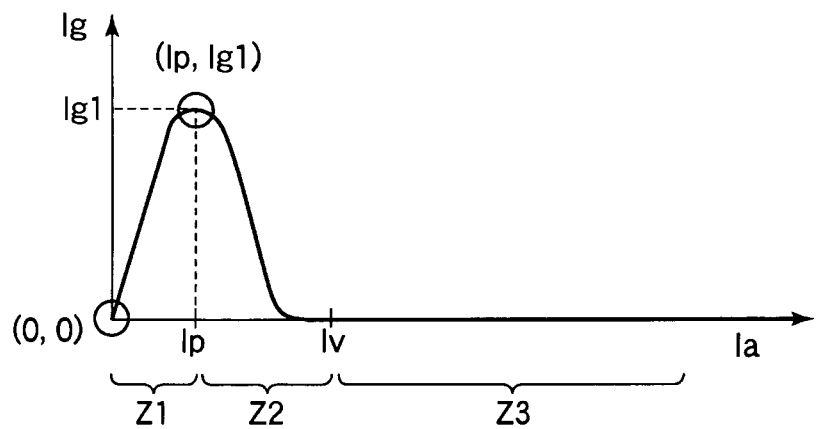
FIG. 21D illustrates changes in the gate current drawn to the same scale of the anode current as in FIGS. 21C.
Figure 21E:
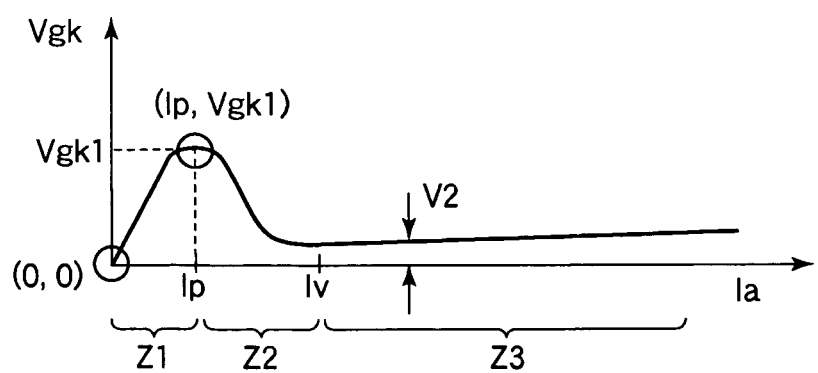
FIG. 21E illustrate changes in the date-cathode voltage Vgk with the anode current of the light emitting thyristor.

FIGS. 21C, 21D, and 21E illustrate changes in the anode voltage Va, gate current Ig, and gate-cathode Voltage Vgk with the anode current Ia, respectively, when the light emitting thyristor 210 shown in FIGS. 21A and 21B turns on.

FIG. 21C plots the anode current Ia as the abscissa and the anode voltage Va as the ordinate.

When the light emitting thyristor 210 is OFF, the anode current Ia is substantially zero, which is shown at the origin (0, 0) of the FIG. 21C. When the anode voltage Va begins to increase as shown in FIG. 21C to reach a voltage Vp, the anode-gate voltage Vag of the light emitting thyristor 210 is equal to the emitter-base voltage Vbe of the PNP transistor 221, and the output voltage VoL of the first gate driver 162 at the Low level is equal to the gate-source voltage Vgs of the PMOS 404 of the first gate driver 162 shown in FIG. 14B. Thus, there is the following relationship among Vp, Vag, VoL and Vgs.

$$Vp=Vag+VoL=Vag+Vgs$$

The voltage Vp is a forward voltage that causes a maximum value of the gate current Ig (i.e., the base current Ib of the PNP transistor 221) to flow. A circled portion (Ip, Vp) on the curve shown in FIG. 21C indicates a boundary between the OFF region Z1 of the light emitting thyristor 210 and the ON region Z2.

As the anode current Ia increases, the anode voltage Va increases, eventually reaching a point (Iv, Vv) shown in FIG. 21C, which is a boundary between the ON region Z2 and the ON region Z3 of the light emitting thyristor 210. When the anode current Ia has reached Iv, the gate current Ig has decreased to substantially zero. This implies that the first gate driver 162 is effectively disconnected from the gate of the light emitting thyristor 210.

As the anode current Ia further increases, the anode voltage Va further increases, finally reaching a point (I1, V1) shown in FIG. 21C where the light emitting thyristor 210 emits light produced by the an anode current I1 supplied from the driver IC 100.

FIG. 21D illustrates changes in the gate current drawn to the same scale of the anode current as in FIGS. 21C. FIG. 21D illustrates the relationship among the gate current Ig, the peak value of Ig1 of the gate current Ig, the anode voltage Vp, and the anode current Ip.

FIG. 21E illustrate changes in the gate-cathode voltage Vgk with the anode current of the light emitting thyristor, and plots the anode current Ia as the abscissa and the gate-cathode voltage Vgk as the ordinate.

When the light emitting thyristor begins to turn on, the gate current Ig is developed to determine the output voltage VoL, which is equal to the gate-cathode voltage Vgk of the light emitting thyristor 210. When the light emitting thyristor 210 becomes completely turned ON, i.e., when the NPN transistor 222 is in its saturation region, the output voltage VoL decreases to a voltage V2 shown in FIG. 21E. The voltage V2 corresponds to the emitter-collector saturation voltage Vce (sat) of the NPN transistor 222.

Thus, the gate-source voltage of the PMOS transistor 404 in the first gate driver 162 is lower than the threshold Vt i.e., V2<Vt, so that the PMOS transistor 404 is in its OFF region or a sub threshold region to be exact, and the gate current Ig shown in FIG. 21B falls to substantially zero.

As described above, the first gate driver 162 shown in FIG. 14B is used to prevent the gate current Ig from flowing out of the light emitting thyristor 210 after the light emitting thyristor 210 has turned on, thereby holding the light emitting thyristor 210 in its ON state with the anode current Ia substantially equal to the cathode current Ik. This implies that adjusting the anode current Ia provides a corresponding light output. This operation is achieved by employing the PMOS transistor 404 at the output of the first gate driver 162 shown in FIG. 14B.

In contrast, if an NMOS transistor is used in place of the PMOS 404 just as in the conventional CMOS output circuit, the low level output VoL of the first gate driver 162 would decrease to substantially 0 volts, allowing the base current Ib of the PNP transistor 222 to continue to flow as the gate current Ig into the first gate driver 162. Thus, the collector current of the PNP transistor 222 decreases by the gate current Ig accordingly, causing the cathode current Ik of the light emitting thyristor 210 to decrease. Thus, the light output of the light emitting thyristor 210 may fluctuate. The first gate driver 162 (FIG. 14B) according to the first embodiment effectively prevents such a drawback.

Next, the operation of the first gate driver 162 shown in FIGS. 14A and 14B when outputting the high level output signal will be described. This operation corresponds to when the light emitting thyristor 210 shown in FIG. 21A is in its OFF state.

For example, assume that the input terminal IN of the first gate driver 162 is at the High level. At this moment, the output node N401 of the inverter 401 in the first gate driver 162 is at the Low level, and the output node N402 of the inverter 402 is at the High level so that the PMOS transistor 404 is in its OFF state.

Since the timing adjusting circuit 405 is in its ON state at all times, when the node N401 goes low (Low level), the output node N405 of the timing adjusting circuit 405 is also in its Low level, causing the PMOS transistor 403 to turn on. Thus, the drain voltage of the PMOS 403 is substantially equal to the supply voltage VDD, causing the PMOS transistor 406 connected to the PMOS transistor 403 to turn on so that the output terminal OUT goes high (High level).

Because the gate of the PMOS transistor 406 is connected to the output terminal OUT, when the output terminal OUT reaches the potential equal to VDD-Vt, the gate-source voltage Vgs of the PMOS transistor 406 will have reached a value substantially equal to the threshold voltage Vt so that the PMOS transistor 406 turns off. In this manner, even though the output terminal OUT of the first gate driver 162 goes high (High level), the potential of the output terminal OUT increases only to a potential equal to VDD-Vt and will not further increase to the supply voltage VDD as opposed to a comparative gate driver 162A shown in FIG. 15 in which the output terminal OUT will go up to the supply voltage VDD.

{Changes in Drive Signals}

Figure 22A:
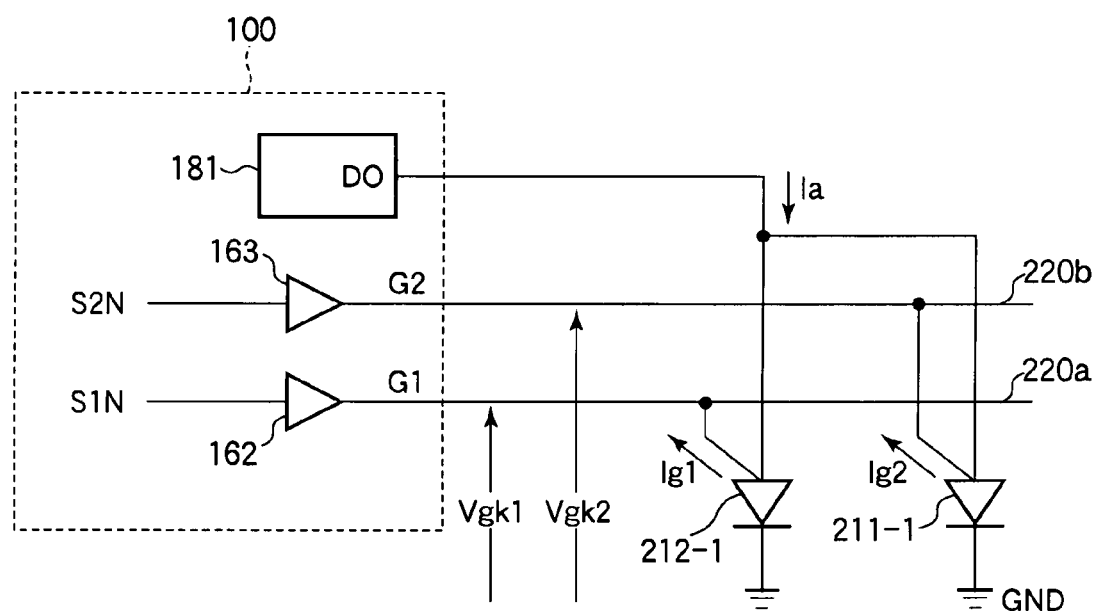
FIG. 22A is a simple model representation illustrating only two light emitting thyristors shown in FIG. 5.

FIG. 22A is a simple model representation illustrating only two light emitting thyristors, i.e., 211-1 and 212-1 shown in FIG. 5.

The driver IC 100 includes a driver 181 having a drive current output terminal DO, the first gate driver 162 that receive selecting signal S1N and outputs gate drive signal G1, and the second gate driver 163 that receive selecting signal S2N and outputs gate drive signal G2. The anodes of the light emitting thyristors 211-1 and 212-1 are connected to the drive current output terminals DO of the driver IC 100. The gate of the light emitting thyristor 212-1 is connected to the gate drive signal terminal G1 of the driver IC 100 and the gate of the light emitting thyristors 211-1 is connected to the gate drive signal terminal G2 of the driver IC 100.

Thus, in the optical print head, the gate drive signal terminal G1 is connected to the gates of a plurality of light emitting thyristors 212-1, 212-2, 212-3, . . . via the common wires 220a. The gate drive signal terminal G2 is connected to the gates of a plurality of light emitting thyristors 211-1, 211-2, 211-3, . . . via the common wires 220b. FIG. 22A illustrates only one light emitting thyristor 211-1 and only light emitting thyristor 212-1.

The drive current output terminals DO supply the drive current or anode current Ia to the light emitting thyristors 211-1 and 212-1. The first and second gate drivers 162 and 163 supply the gate currents Ig1 and Ig2 to the light emitting thyristors 212-1 and 211-1. The gate-cathode voltage Vgk1 is the gate-cathode voltage of the light emitting thyristors 212-1 and the gate-cathode voltage Vgk2 is the gate-cathode voltage of the light emitting thyristor 211-1.

Figure 22B:
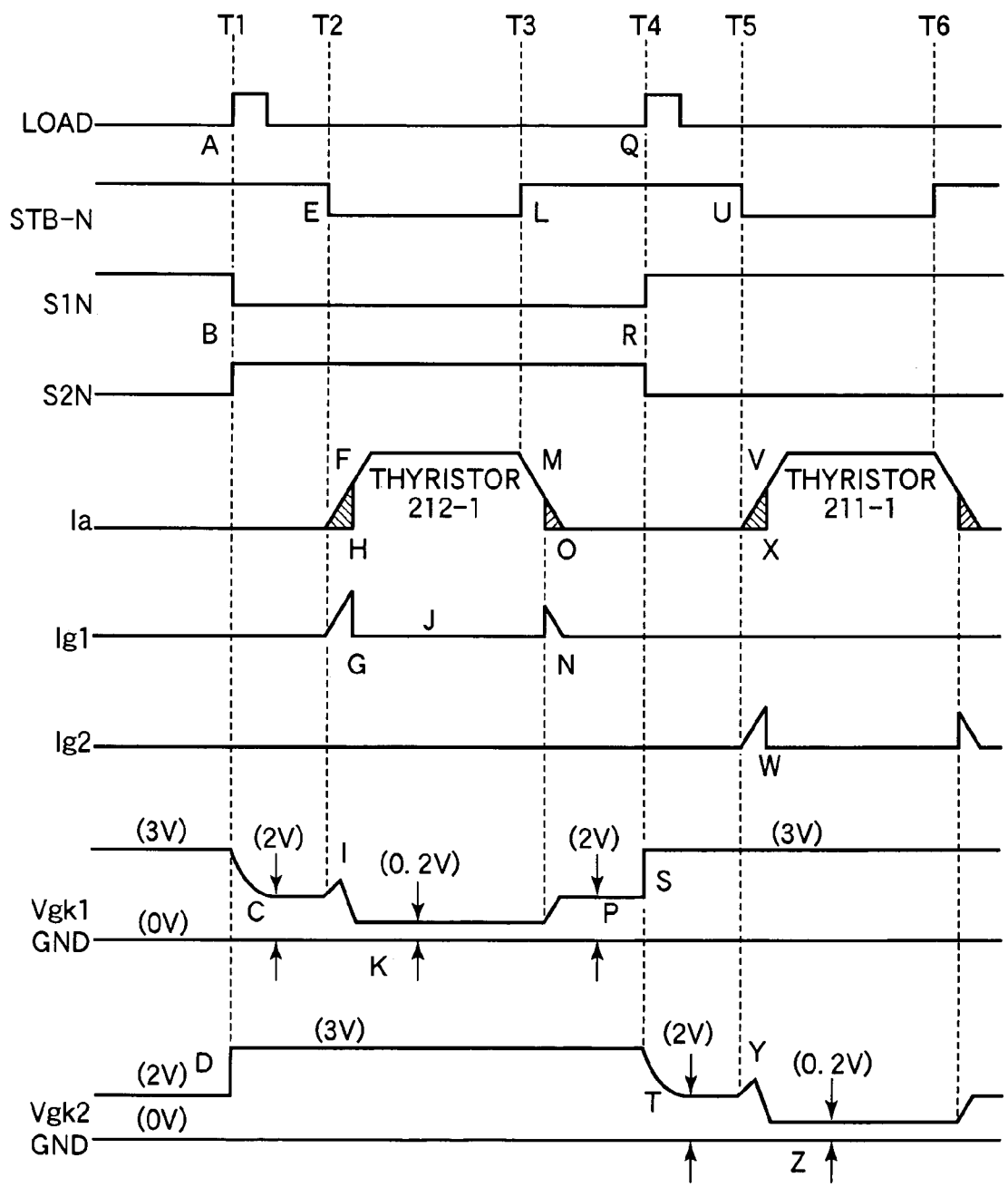
FIG. 22B is a timing chart illustrating the operation of the light emitting thyristors shown in FIG. 22A.

FIG. 22B is a timing chart illustrating the operation of the light emitting thyristors 211-1 and 212-1 shown in FIG. 22A.

The light emitting thyristor 211-1 and 212-1 are driven in a time division manner. The latch signal terminal LOAD corresponds to the latch signal HD-LOAD shown in FIG. 5. The print drive signal STB-N is a negative logic strobe signal inputted to the STB terminal shown in FIG. 7 and corresponds to the print drive signal HD-STB-N shown in FIG. 5.

The signal selector 142 shown in FIG. 7 outputs the selection signal S1N to the first gate driver 162 and the selection signal S2N to the second gate driver 163. The output of the first gate driver 162 is used as the gate drive signal G1 for the light emitting thyristor 212-1. The output of the second gate driver 163 is used as the gate drive signal G2 for the light emitting thyristor 211-1.

The main scanning synch signal HSYNC-N is input to the driver IC 100 to reset the driver IC 100, so that the selection signal S1N is at the High level and the selection signal S2N is at the LOW level. These selection signals S1N and S2N are input to the first and second gate drivers 162 and 163, respectively. The first gate driver 162 outputs the gate drive signal G1 of the High level and the second gate driver 163 outputs the gate drive signals G2 of the Low level.

When the gate drive signals G1 and G2 are at the High level, i.e., VoH is equal to VDD-Vgs where VDD is the power supply voltage and Vgs is the gate-source voltage of the PMOS transistor 406. When the gate drive signals G1 and G2 are at the Low level, VoL is equal to Vgs which is the gate-source voltage of the PMOS transistor 404. The gate-source voltage Vgs is slightly higher than a threshold voltage Vt.

The gate-source voltage Vgs may be changed by adjusting the substrate bias voltage across the source and the substrate, the gate length of the PMOS transistors 406 and 404, or the gate width of the PMOS transistors 406 and 404. For example, if the power supply voltage VDD=5 V and VoL=2 V, then the VoH=3 V and VoL=2 V. These values are shown in FIG. 22B.

Referring to FIG. 22B, upon reception of the latch signal LOAD at time T1 (portion A), the selection signal S1N goes low (Low level) and the selection signal S2N goes high (High level) (portion B). This in turn causes the gate-cathode voltage Vgk1 decreases from about 3V to about 2V (portion C) and the gate-cathode voltage Vgk2 increases from about 2 V to about 3 V.

The print drive signal STB-N for energizing the light emitting thyristor 212-1 goes low (portion E) at time T2, so that the anode current Ia rises (portion F). As described in FIG. 21A, a part of the anode current Ia injected into the anode flows out from the gate as the gate current Ig so that the light emitting thyristor 212-1 turns on.

A hatched portion depicted at H of the anode current Ia corresponds to the gate current Ig1 denoted at G. The gate current Ig1 flows into the first gate driver 162, so that the output voltage of the first gate driver 162 somewhat increases (portion I). Since the light emitting thyristor 212-1 turns on, the output voltage of the first gate driver 162 will go down to about 0.2V (portion K). The value of 0.2V corresponds to the Vce(sat), which is the collector-emitter saturation voltage of the NPN transistor 222 described with reference to FIG. 21B.

At this moment, the gate current Ig1 causes the light emitting thyristor 212-1 to turn on to emit light. It is to be noted that the gate-cathode voltage Vgk2 of the light emitting thyristor 211-1 is about 3V which is the High level, not causing the gate current Ig2 to flow from anode to gate. Thus, the light emitting thyristor 211-1 remains turned off.

At time T3, the print drive signal STB-N goes high (High level) at portion L, causing the anode current Ia to decrease as depicted at M. When the anode current Ia decreases below a holding current determined by the characteristics of the light emitting thyristors 211-1 and 212-1, the light emitting thyristors 211-1 turns off, the anode voltage rising up to cause the gate current Ia at portion N. The gate current Ig1 at portion N is caused by the anode current Ia at a hatched portion depicted at O. As the gate current Ig1 at portion N diminishes, the light emitting thyristor 212-1 turns off so that the gate-cathode voltage Vgk1 increases at portion P to become about 2V which is the Low level (=VoL) of the buffer 162.

At time T4, the latch signal LOAD is input to the driver IC 100, as shown at portion Q, and the selection signal S1N goes high (High level) at portion R, and the selection signal S2N goes low. Then, the gate drive signals G1 and G2 go high (High level) and low (Low level), respectively. The output voltage VoH of the High level of the buffer 162 is about 3 V as depicted at portion S and will not increase to the power supply voltage VDD. Also, the gate-cathode voltage Vgk2 decreases to about 2 V as depicted at portion T.

At time T5, the print drive signal STB-N goes low (Low level) as depicted at portion U to cause the anode current Ia again to rise as depicted at portion V. As described with reference to FIG. 21B, a portion of the anode current Ia flows out from the gate to become a gate current Ig2 when the light emitting thyristor 211-1 is being turned on. The gate current Ig2 causes the light emitting thyristor 211-1 to turn on.

A hatched portion depicted at X of the anode current Ia corresponds to the gate current Ig2, denoted at G, of the light emitting thyristor 211-1. The gate current Ig2 flows into the second gate driver 163, so that the output voltage of the second gate driver 163 somewhat increases (portion Y). As the light emitting thyristor 211-1 turns on, the output voltage of the second gate driver 163 will decrease to about 0.2V (portion Z). The value of 0.2V corresponds to the Vce(sat), which is the collector-emitter saturation voltage of the NPN transistor 222 described with reference to FIG. 21B.

At this moment, the gate current Ig2 causes the light emitting thyristor 211-1 to turn on to emit light. It is to be noted that the gate-cathode voltage Vgk1 of the light emitting thyristor 212-1 is about 3V which is the High level, not causing the gate current Ig1 to flow from anode to gate. Thus, the light emitting thyristor 212-1 remains turned off. At time T6, the print drive signal STB-N again goes high (the High level).

In this manner, the gate drive signals G1 and G2 are switched between the High level and the Low level alternately, the gate drive signals G1 and G2 being in opposite levels. In other words, when the gate drive signal G1 is at the Low level and the gate drive signal G2 is at the High level, the light emitting thyristor 212-1 turns on and the light emitting thyristor 211-1 turns off. When the gate drive signal G1 is at the High level and the gate drive signal G2 is at the Low level, the light emitting thyristor 212-1 turns off and the light emitting thyristor 211-1 turns on.

Thus, the print drive signal STB-N at portion E shown in FIG. 22B causes the light emitting thyristor 212-1 to turn on and the light emitting thyristor 211 to turn off. The print drive signal STB-N at portion U causes the light emitting thyristor 211-1 to turn on the light emitting thyristor 212 to turn off.

As described above, the light emitting thyristors 211-1 and 212-1 are turned on when the anode currents Ia flow therethrough, and their light outputs depend on the value of the anode current Ia. The light emitting thyristors 211-1 and 212-1 can be turned off by setting the anode currents Ia to zero. The anode current Ia may be set to zero by setting the print data signals HD-DATA3 to HD-DATA0 to their off state as depicted at the portions U and V shown in FIG. 16.

{Modification 1 to First Embodiment}

Figure 23:
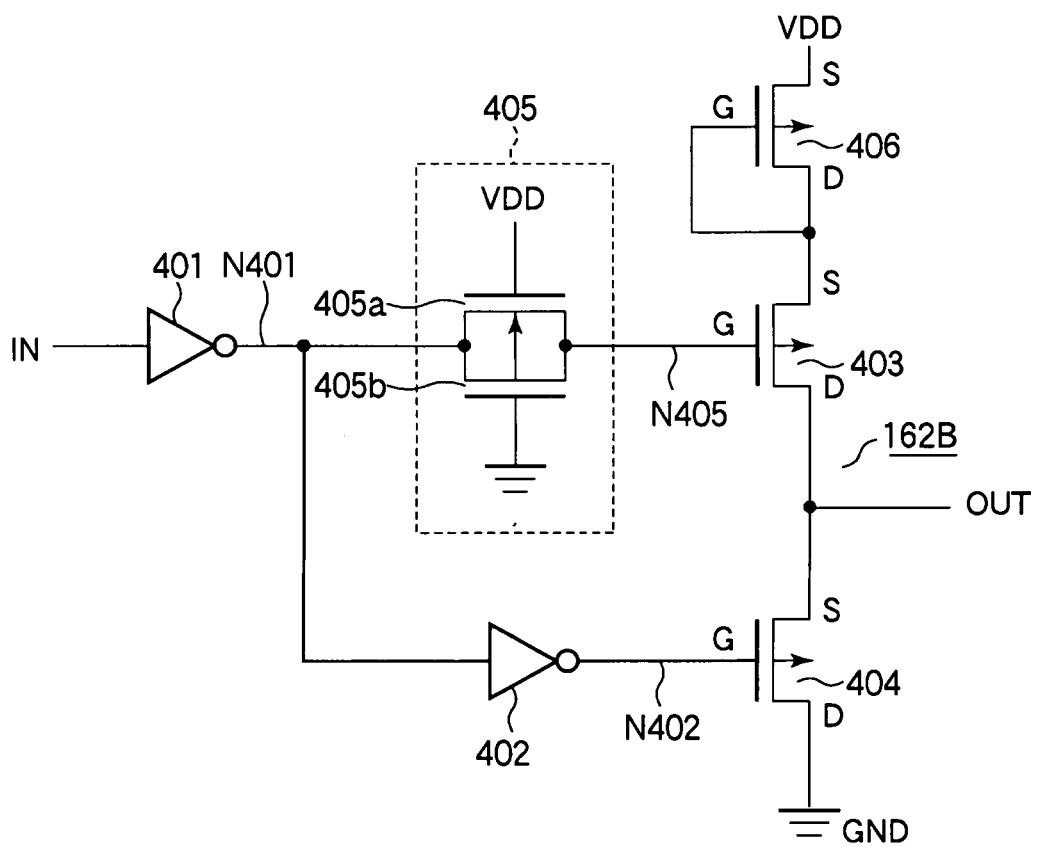
FIG. 23 is a schematic diagram illustrating a first gate driver 162B which is a modification to the first gate driver 162 shown in FIG. 14B.

FIG. 23 is a schematic diagram illustrating a first gate driver 162B which is a modification to the first gate driver 162 shown in FIG. 14B. Elements common to those shown in FIG. 14B have been given the same reference numerals.

The first gate driver 162B has the same configuration as the first gate driver 162 except that the PMOS transistor 406 is inserted between the VDD and the PMOS transistor 403. In other words, the PMOS transistor 406 has its source connected to the VDD terminal and its gate and drain connected to the source of the PMOS transistor 403. The drain of the PMOS transistor 403 is connected to the output terminal OUT.

The operation of the first gate driver 162B will be described. For example, when the input terminal IN of the first gate driver 162B is at the Low level (about 0 V), the output node N401 of the inverter 401 is at the High level (about 5 V) and the output node N402 of inverter 402 is at the Low level (0 V). At this moment, the PMOS transistor 403 becomes off and the PMOS transistor 404 becomes on, so that the output terminal OUT decreases to the output voltage VoL. The output voltage VoL is substantially equal to the gate-source voltage Vgs of the PMOS transistor 404. The gate-source voltage Vgs depends on the threshold-voltage Vt of the PMOS transistor 404, and is typically about 2V.

When the input terminal IN of the first gate driver 162B is at the High level (about 5 V), the output node N401 of the inverter 401 is at the Low level (about 0 V) and the output node N402 is at the High level (about 5 V). At this moment, the PMOS transistor 404 goes off and the PMOS transistor 403 goes on, causing the gate voltage of the PMOS transistor 406 to decrease so that the PMOS transistor 406 also becomes on and the output terminal OUT goes high (High level) to the output voltage VoH. The output voltage VoH is substantially equal to VDD-Vgs, where VDD is about 5 V. The gate-source voltage Vgs depends on the threshold voltage Vt of PMOS transistors, and is typically about 2 V. Therefore, the output voltage VoH is about 3 V.

{Modification 2 to First Embodiment}

Figure 24:
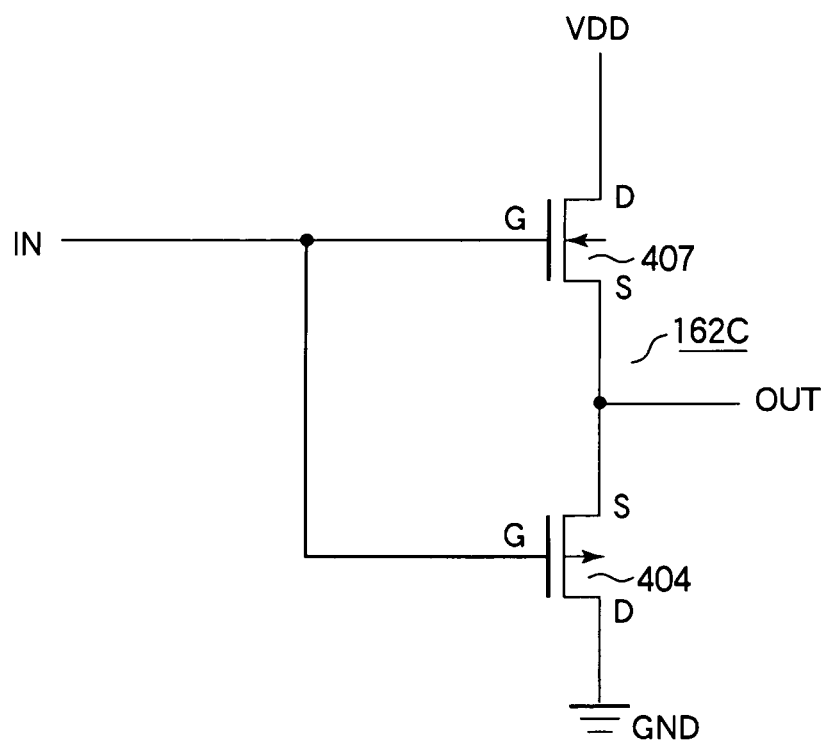
FIG. 24 is a schematic diagram illustrating a first gate driver 162C which is a modification to the first gate driver 162 shown in FIG. 14B.

FIG. 24 is a schematic diagram illustrating a first gate driver 162C which is a modification to the first gate driver 162 shown in FIG. 14B. Elements similar to those in FIG. 14B have been given like reference numerals.

The gate driver 162C includes a first switch 407 (for example NMOS) that operates to set the output voltage VoH below the supply voltage VDD.

The first gate driver 162C also has a second switch (For example PMOS) 404. The gates of the NMOS transistor 407 and PMOS transistor 404 are connected to the input terminal IN. The NMOS transistor 407 has its drain connected to the VDD terminal and its source connected to the output terminal OUT and the source of the PMOS transistor 404. The drain of the PMOS 404 is connected to the ground GND.

Next, the operation of the gate driver 162C shown in FIG. 24 will be described. For example, when the input terminal IN of the first gate driver 162 is at the Low level (substantially 0 volts), the PMOS transistor 404 is ON, causing the voltage at the output terminal OUT to the VoL. The VoL corresponds to the gate-source voltage Vgs of the PMOS transistor 404 and is determined by the threshold voltage Vt. The VoL is typically about 2V.

When the input terminal IN of the first gate driver 162C is at the High level (about 5 V), the NMOS transistor 407 becomes ON, causing the potential at the output terminal OUT to rise to the high level output VoH. The VoH corresponds to VDD-Vgs, where VDD (about 5 V) is the supply voltage and Vgs is the gate-source voltage of the NMOS transistor 407. The voltage Vgs is determined by the threshold voltage of the NMOS transistor 407 and is typically about 2 V. Therefore, the VoH is about 3 V.

The gate driver 162B shown in FIG. 23 and the gate driver 162C shown in FIG. 24 operate in a manner similar to the first gate driver 162 shown in FIG. 14B to set the low level output VoL higher than 0 volts and the high level output VoH lower than the supply voltage VDD (5 V). Thus, the gate current Ig can be substantially zero after the light emitting thyristor 210 has turned on and the voltage applied across the gate and cathode can be lower than the breakdown voltage of the light emitting thyristor 210.

{Effects of First Embodiment}

The gate drivers 162, 162B, 162C, and 163, the driver IC 100 incorporating these gate drivers, and optical print head 13 provide the following effects.

When the driver IC 100 drives the gate of the light emitting thyristor 210 in a time division manner, the gates of light emitting thyristors to be energized are set to the Low level and those of light emitting thyristors not to be energized are set to the High level. Generally speaking, the driver IC 100 is manufactured using a standard CMOS process, and operates at a 5V supply voltage. The comparative gate driver 162A shown in FIG. 15 has the High level substantially equal to VDD (5 V) and the light emitting thyristor 210 can sustain on about 7 V which is not sufficient. Therefore, in some cases, the light emitting thyristor 210 may be damaged by a signal of the High level.

However, the first gate drivers 162, 162B (modification 1), and 162C (modification 2) can output a high level output signal having a voltage lower than supply voltage VDD (5 V), thereby maintaining the gate-cathode voltage of the non-energized light emitting thyristors to a value lower than the sustaining voltage of the light emitting thyristors. This prevents the light emitting thyristors from being damaged.

The image forming apparatus 1 according to the first embodiment, modification 1, and modification 2 employs the optical print head 13 incorporating the driver IC 100. Thus, a high quality image forming apparatus (printer, copying machine, facsimile machine, and MFP) with excellent space efficiency and light output efficiency can be obtained. In other words, the optical print head 13 can be effectively used in monochrome image forming apparatus and multi color image forming apparatus as well as in the aforementioned full color image forming apparatus 1. The use of the optical print head 13 is particularly effective when employed in a full color image forming apparatus that employs a plurality of exposing units.

Second Embodiment

{Configuration of Gate Driver}

Figure 25A:
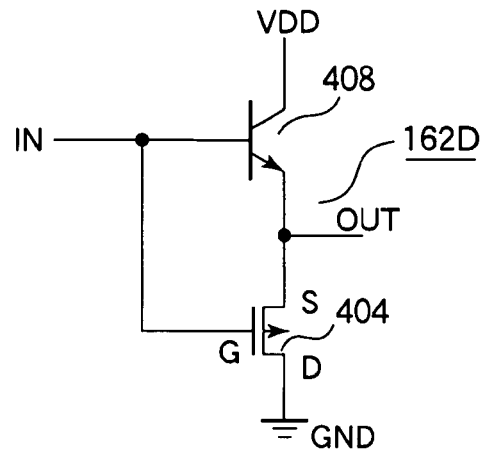
FIG. 25A is a schematic diagram illustrating the gate driver.
Figure 25B:
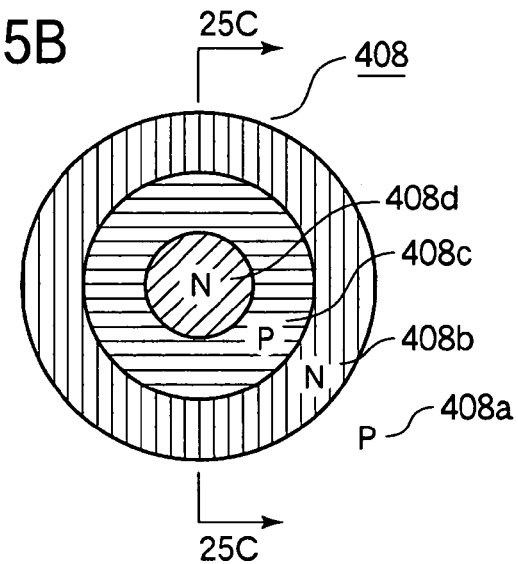
FIG. 25B is a top view illustrating the configuration of an NPN transistor shown in FIG. 25A.
Figure 25C:
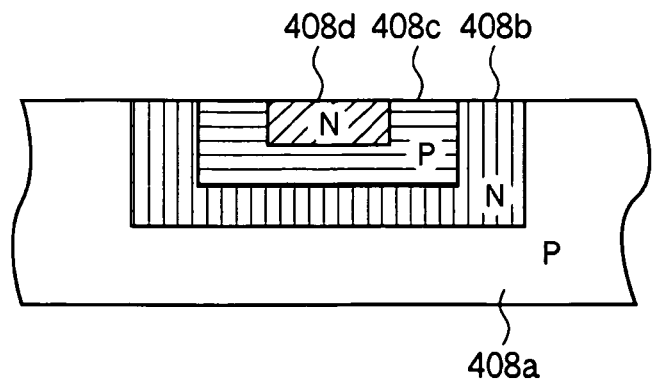
FIG. 25C is a cross-sectional view of the gate driver taken along a line 25C-25C in FIG. 25B.

FIGS. 25A-25C illustrate the configuration of a gate driver according to a second embodiment. FIG. 25A is a schematic diagram illustrating the gate driver. FIG. 25B is a top view illustrating the configuration of an NPN transistor shown in FIG. 25A. FIG. 25C is a cross-sectional view of the gate driver taken along a line 25C-25C in FIG. 25B. Elements of the gate driver 162 shown in FIGS. 25A-25C similar to those shown in FIG. 14B have been given the same reference numerals.

Referring to FIG. 25A, just as in the first embodiment, a gate driver 162D includes a first switch element 408 (e.g., NPN transistor) corresponding to the PMOS transistor 403, and a second switch element 404 (e.g., PMOS transistor). The base of the NPN transistor 408 and the gate of the PMOS transistor 404 are connected to an input terminal IN. The NPN transistor 408 has a collector connected to a supply voltage terminal VDD and an emitter connected to an output terminal OUT. The PMOS transistor 404 has a drain connected to the ground GND and a source connected to the output terminal OUT.

Referring to FIGS. 25B and 25C, the NPN transistor 408 includes an N well region 408b, a P well region 408c, and an N type region 408d, all being formed in a silicone-based P type semiconductor substrate 408a. The N well region 408b is formed in the shape of an island by diffusing an N type impurity in a predetermined area of a P type semiconductor substrate 408. The P type well region 408c is formed in the shape of an island by diffusing a P type impurity in the N well region 408b. The N type region 408d is formed in the P well region by diffusing an N type impurity.

Referring to FIG. 25C, the N well region 408b, the P well region 408c, and an N type region 408d form an N-P-N three-layer structure. Though not specifically shown in FIG. 25C, electrodes are formed on the N well region 408b, P well region 408c, and N type region 408d to form an NPN transistor 408. The N well region 408b serves as a collector, the P well region 408c serves as a base, and the N type region 408d serves as an emitter.

{Operation of Gate Driver}

When the input terminal IN is at the Low level (about 0 V), the PMOS 404 becomes ON causing the voltage at the output terminal OUT to decrease the Low level (i.e., VoL). The Low level output voltage VoL corresponds to the gate-source voltage Vgs of the PMOS transistor 404, and is determined by the threshold voltage Vt of the PMOS transistor 404, typically about 2 V.

When the input terminal IN is at the High level (about 5 V), the NPN transistor 408 turns on to increase the voltage at the output terminal OUT to the High level output voltage, VoH. The VoH is substantially equal to VDD-Vbe, which is typically about 0.6 V. Thus, the VoH is about 4.4 V.

As described above, the gate driver 162D operates in the same way as the gate driver 162 of the first embodiment (FIG. 14B). That is, the Lowe level output voltage VoL is higher than 0 V and the High level output voltage VoH is lower than the supply voltage VDD (about 5 V). Thus, the gate current of the light emitting thyristor 210 is substantially zero after the light emitting thyristor 210 shown in FIG. 5 has turned on. When the light emitting thyristor 210 is in its OFF state, the voltage applied across the gate and cathode can be lower than the breakdown voltage of the light emitting thyristor 210.

{Changes in Drive Signals}

Figure 26:
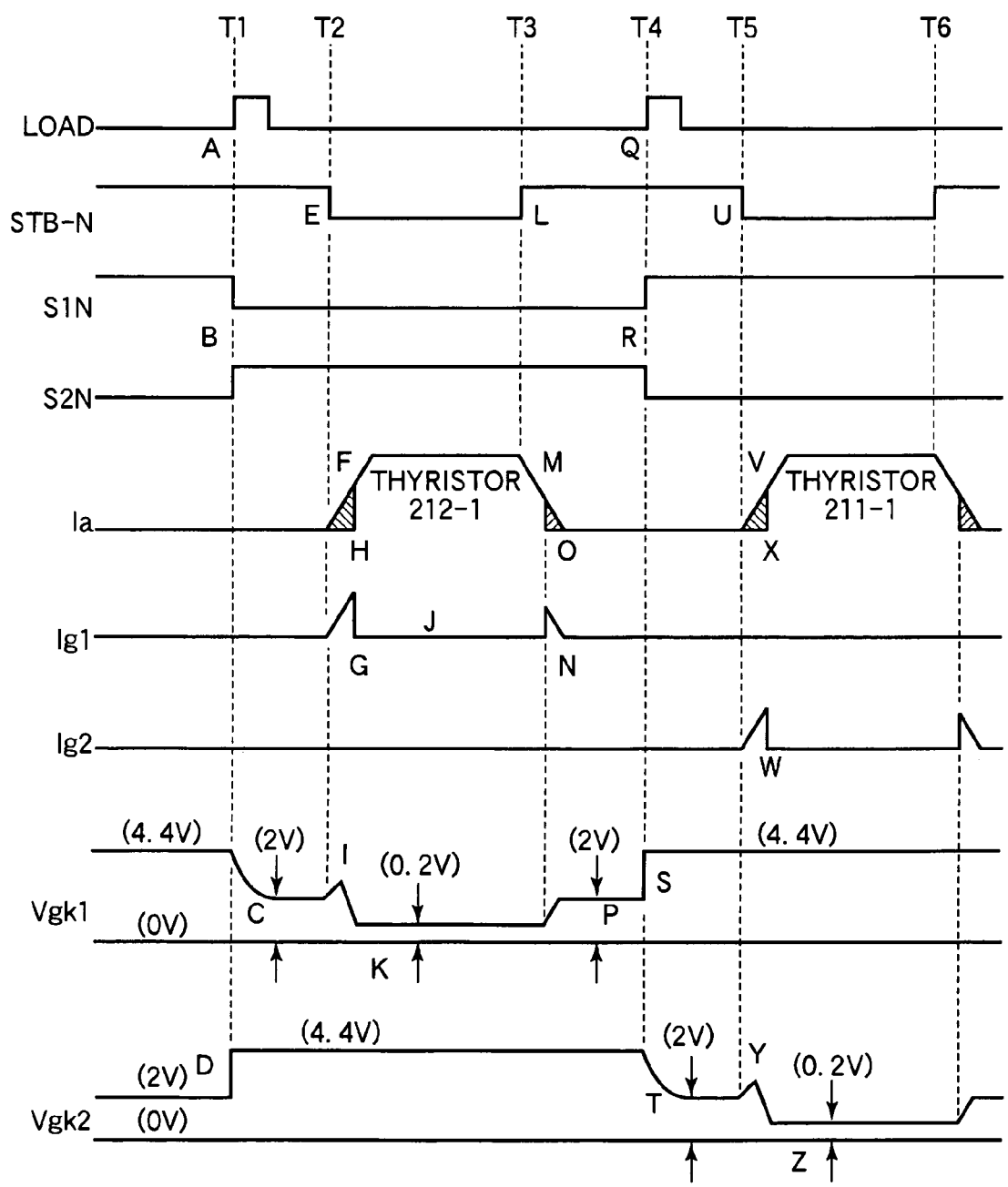
FIG. 26 is a timing chart illustrating the operation of two adjacent light emitting thyristors shown in FIG. 22A when the two gate drivers are used.

FIG. 26 is a timing chart illustrating the operation of two adjacent light emitting thyristors 211-1 and 212-1 shown in FIG. 22A when the two gate drivers 162D are used.

Just as in FIG. 22B (first embodiment), the thyristors 211-1 and 212-1 are driven in a time division manner. The maximum gate-cathode voltage Vgk1 of the light emitting thyristor 211-1 and the maximum gate-cathode voltage Vgk2 of the light emitting thyristor 212-1 are 3 V. In contrast, in the second embodiment, the maximum gate-cathode voltage Vgk1 of the light emitting thyristor 212-1 and the maximum gate-cathode voltage Vgk2 of the light emitting thyristor 211-1 are 4.4 V.

Referring to FIG. 26, the main scanning sync signal HD-HSYNC-N input to the driver IC 100 rests the driver IC 100 so that the selection signal S1N goes high (High level) and the selection signal S2N goes low (Low level). The selection signal S1N is input into the first gate driver 162 shown in FIG. 22A and the selection signal S2N is input into the second gate driver 163. Thus, the first gate driver 162 outputs the gate drive signal G1 at the High level and the second gate driver 163 outputs the gate drive signal G2 at the Low level.

The drive signals G1 and G2 have an output voltage VoH equal to VDD-Vbe where VDD is the supply voltage and Vbe is the base-emitter voltage of the NPN transistor 408, and an output voltage VoL equal to the gate-source voltage Vgs of the PMOS transistor 404.

The gate-source voltage Vgs is slightly higher than the threshold voltage Vt, and can be varied by adjusting a substrate bias voltage across the source and the substrate, gate length, and gate width of the PMOS transistor 404. The following is a design example. When the supply voltage VDD=5 V, Vbe=0.6 V, and Vgs=2 V, the output voltage VoH=4.4 V and VoL=2 V. These values are shown as exemplary values in FIG. 26.

When the latch signal LOAD is input into the driver IC 100 at time T1 (at portion A in FIG. 26), the selection signal S1N goes low (Low level), VoL, and the selection signal S2N goes high (High level), i.e., VoH which in turn causes the gate-cathode voltage Vgk1 to decrease from about 4.4 V to about 2 V as depicted at portion C, and the gate-cathode voltage Vgk2 to increase from about 2 V to about 4.4 V.

At time T2, the print drive signal STB-N goes low (Low level) as depicted at portion E, causing the anode current Ia of the thyristor 212 to rise as depicted at portion F. As described with respect to FIG. 21B, when the light emitting thyristor 212-1 begins to turn on, a part of the anode current Ia injected into the light emitting thyristor 212-1 will flow out as a gate current Ig from the gate of the light emitting thyristor 212-1, thereby turning on the light emitting thyristor 212-1.

The hatched portion of the anode current Ia (portion H) becomes a gate current Ig1 (portion G). The gate current Ig1 flows into the gate driver 162 shown in FIG. 22A so that the output voltage of the gate driver 162 increases slightly (portion I). As the light emitting thyristor 212-1 turns on, the gate-cathode voltage Vgk1 decreases to about 0.2 V (portion K). The gate-cathode voltage Vgk1 equal to 0.2 V is substantially equal to the emitter-collector saturation voltage Vce (sat) of the NPN transistor 222 shown in FIG. 21E.

The gate current Ig causes the light emitting thyristor 212-1 shown in FIG. 22A to turn on to emit light. However, the gate-cathode voltage Vgk2 of the light emitting thyristor 211-1 is about 4.4 V which is the High level so that the gate current Ig2 will not flow from anode to gate and therefore the light emitting thyristor 211-1 remains de-energized.

At time T3, the print drive signal STB-N goes high (High level) as depicted at the portion L, causing the anode current Ia to decrease as depicted at portion M. When the anode current Ia has decreased below the holding current of the light emitting thyristor 212, the light emitting thyristor begins to turn off and the anode voltage begins to increase. The anode voltage causes the gate current Ig1 to flow as depicted at the portion N. The gate Ig1 is a part of the anode current Ia and corresponds to the hatched portion O of the anode current Ia. As the gate current Ig1 depicted at portion N decreases, the light emitting thyristor 212 will enter its OFF region so that the gate-cathode voltage Vgk1 will increase to about 2 V (portion P) which is the Low level output voltage VoL of the gate driver 162.

At time T4, the latch signal LOAD as depicted at portion Q is input into the driver IC 100, causing the first selection signal S1N to go high (High level) and the second selection signal S2N to go low (Low level) as depicted at portion R. Thus, the gate drive signal G1 goes high (High level) and the gate drive signal G2 goes low (Low level). As described above, the High level output voltage VoH of the gate driver 162 is about 4.4 V as depicted at portion S and will not increase to the supply voltage VDD. Meanwhile, the gate-cathode voltage Vgk2 will decrease to about 2 V as depicted at portion T.

At time T5, the print drive signal STB-N as depicted at portion U goes low (Low level), causing the anode current Ia to begin to flow again as depicted at portion V. As described with reference to FIG. 21A, when the light emitting thyristor 211-1 begins to turn on, a part of the anode current Ia flows out of the gate as the gate current Ig2, causing the light emitting thyristor 211-1 to enter its ON state.

A hatched portion of the anode current Ia denoted by X corresponds to the gate current Ig2 of the light emitting thyristor 211-1 as depicted at portion W. The gate current Ig2 flows into the output terminals of the gate driver 163 to cause the output voltage of the gate driver 163 to increase slightly as depicted at portion Y. The output voltage of the-gate driver 163 will then decrease to about 0.2 V (portion Z) as the light emitting thyristor 211-1 enters its ON state. This voltage of 0.2 V corresponds to the collector-emitter saturation voltage Vce(sat) of the NPN transistor 222 described with reference to FIG. 21B.

The gate current Ig2 causes the light emitting thyristor 211-1 to turn on to emit light. Meanwhile, the gate-cathode voltage Vgk1 of the light emitting thyristor 212 is about 4.4 V which is the High level, and no gate current Ig1 flows from anode to gate. Thus, the light emitting thyristor 212-1 remains off. At time T6, the print drive signal STB-N goes high (High level), causing the anode current Ia of the light emitting thyristor 211-1 to decrease.

In this manner, the light emitting thyristors 212-1 and 211-1 shown in FIG. 22A are alternately switched between the ON state and the OFF state such that the High level of G1 and G2 causes the light emitting thyristors 212 and 211 to turn on. The gate drive signals G1 and G2 being in opposite levels. For example, the falling edge of the print drive signal STB-N at portion E causes the thyristors 212-1, 212-2, . . . to turn on and the thyristors 211-1, 211-2, . . . to turn off, and the falling edge at portion U causes the thyristors 211-1, 211-2, . . . to turn on and the thyristors 212-1, 212-2, . . . to turn off.

As described above, when the anode current Ia flows, the Light emitting thyristors 211-1 and 212-1 turn on, the light output being determined by the anode current Ia. The anode current Ia can be shut off by setting the print data signals HD-DATA3 to HD-DATA0 (portions U and V) shown in FIG. 16) to the OFF state, thereby turning off the light emitting thyristors 211-1 and 212-1.

{Modification 1 to Second Embodiment}

Figure 27:
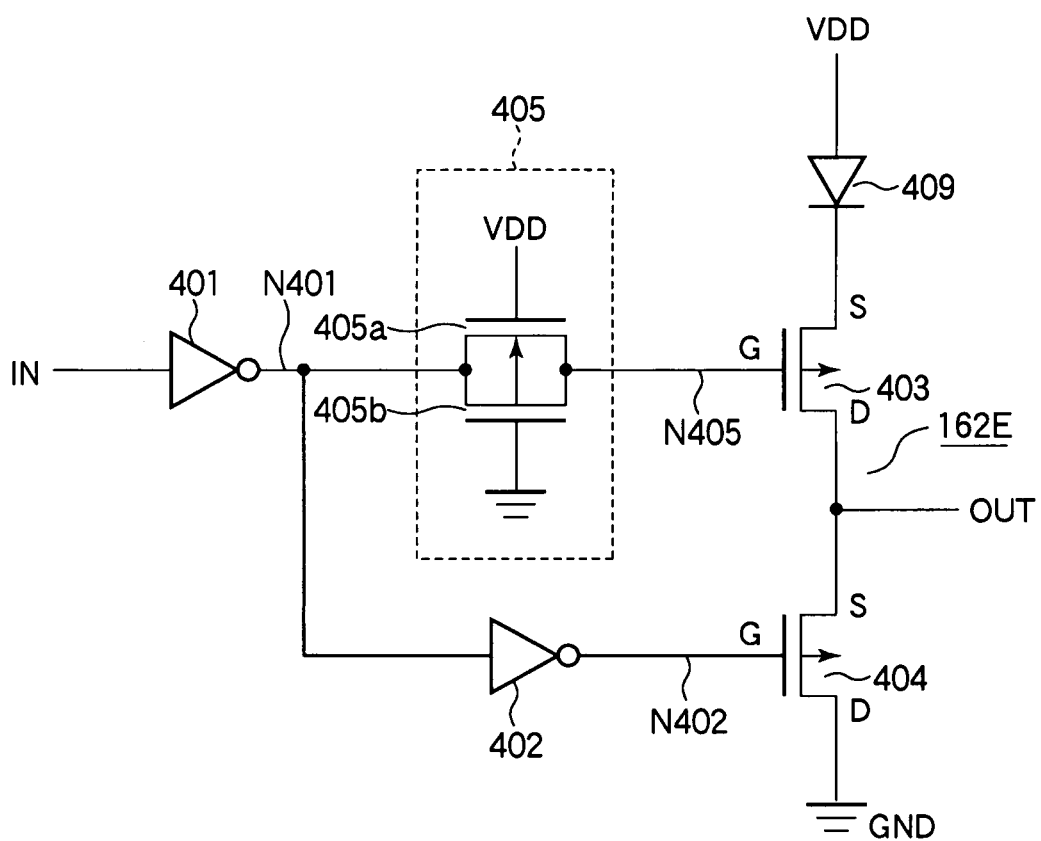
FIG. 27 is a schematic diagram illustrating a modification to the gate driver shown in FIG. 25.

FIG. 27 is a schematic diagram illustrating a modification to the gate driver 162D shown in FIG. 25. Elements similar to those shown in FIGS. 23 and 25 have been given the common reference numerals.

The gate driver 162E differs from the gate driver 162B (FIG. 23) in that a diode 409 is used in place of the PMOS transistor 406. The diode 409 serves to set the High level output voltage VoH to a value lower than VDD.

The input terminal IN is connected to the gate of a first switching element, e.g., PMOS transistor 403 via the inverter 401 and the timing adjusting circuit 405. The diode 409 has its anode connected to the VDD terminal and its cathode connected to the output terminal OUT through the PMOS transistor 403. The output node N401 of the inverter 401 is connected to the gate of the second switching element, e.g., PMOS transistor 404 via the inverter 402. The output terminal OUT is connected to the ground GND through the PMOS transistor 404.

The timing adjusting circuit 405 is an analog switch that includes an NMOS 405a and a PMOS 405b. The timing adjusting circuit 405 is employed for the purpose of delaying the signal fed to the PMOS transistor 403 by an amount of time substantially equal to the delay time of the inverter 402, so that the PMOS transistor 403 turns on substantially at the same that the PMOS transistor 404 turns off, and so that the PMOS transistor 403 turns off substantially at the same that the PMOS transistor 404 turns on. This prevents malfunction of the gate driver 162E due to a crowbar current from the supply voltage terminal VDD to the ground GND. The remaining configuration is the same as those shown in FIGS. 14B and 23.

The operation of the gate driver 162E shown in FIG. 27 will be described. When the input terminal IN of the gate driver 162E is at the Low level (about 0 V), the output node N401 of the inverter 401 is at the High level (about 5 V) and the output node N402 of the inverter 402 is at the Low level (about 0 V). At this moment, the PMOS transistor 403 is OFF and the PMOS transistor 404 is ON so that the voltage at the output terminal OUT decreases to the Low level, i.e., output voltage VoL. The output voltage VoL corresponds to the gate-source voltage Vgs of the PMOS transistor 404 which in turn is determined by the threshold voltage Vt, typically 2 V.

When the input terminal IN of the gate driver 162E is at the High level (about 5 V), the output terminals node N401 of the inverter 401 is at the Low level (about 0 V), and the output terminal node N402 of the inverter 402 is at the High level (about 5V). At this moment, the PMOS transistor 404 becomes OFF while the PMOS transistor 403 becomes ON, causing the voltage at the output terminal OUT to rise to the High level output voltage VoH. The output voltage VoH is equal to VDD-Vf where Vf is the forward voltage of the diode 409 which is typically 0.6 V. Thus, the output voltage VoH is about 4.4 V.

{Modification 2 to Second Embodiment}

Figure 28:
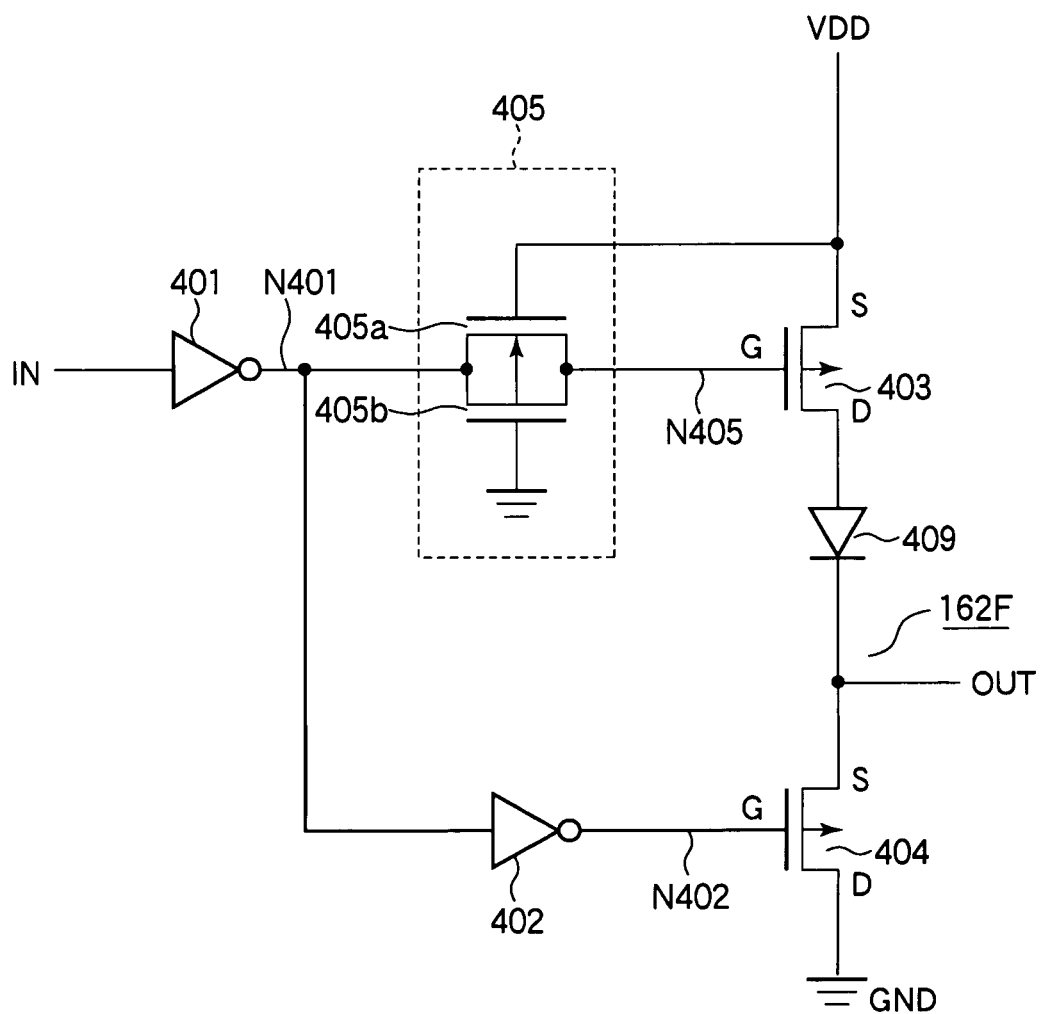
FIG. 28 is a schematic diagram of the gate driver which is a modification to the gate driver of FIG. 25.

FIG. 28 is a schematic diagram of the gate driver 162F which is a modification to the gate driver 162D (FIG. 25). Elements common to the gate driver 162E shown in FIG. 27 have been given like reference numerals.

The gate driver 162F employs the diode 409 of modification 1, which serves to set the output voltage VoH lower than the supply voltage VDD, the diode 409 being positioned on a side of the PMOS transistor 403 opposite the supply voltage terminal VDD.

In other words, the PMOS transistor 403 has its source connected to the supply voltage terminal VDD and its drain connected to the anode of the diode 409. The cathode of the diode 409 is connected to the output terminal OUT. The PMOS transistor 404 has its source connected to the output terminal OUT and its drain connected to the ground GND. The remaining configuration is the same as that of modification 1.

The operation of the gate driver 162F shown in FIG. 28 will be described. When the input terminal IN of the gate driver 162F is at the Low level (about 0 V), the output node N401 of the inverter 401 is at the High level (about 5 V), and the output node N402 of the inverter 402 is at the Low level (about 0 V). At this moment, the PMOS transistor 403 becomes OFF and the PMOS transistor 404 becomes ON, causing the voltage at the output terminal OUT to decrease to the Low level, i.e., VoL. The output voltage VoL is substantially equal to the gate-source voltage Vgs. The gate-source voltage Vgs is determined by the threshold voltage Vt, typically 2 V.

When the input terminal IN of the gate driver 162F is at the High level (about 5 V), the output node N401 of the inverter 401 is at the Low level (about 0 V) and the output node N402 of the inverter 402 is at the High level (about 5 V). At this moment, the PMOS transistor 404 becomes OFF and the PMOS transistor 403 becomes ON, causing the output voltage at the output terminal OUT to increase to the High level output voltage VoH. The output voltage VoH is equal to VDD- Vf where VDD is the supply voltage and Vf is the forward voltage of the diode 409, typically about 0.6 V. Thus, the High level output voltage VoH is about 4.4 V.

As described above, the gate drivers 162D, 162E, and 162F shown in FIG. 25, FIG. 27, and FIG. 28, respectively, operate essentially the same way as the gate driver 162 shown in FIG. 14B, that is, the Low level output voltage VoL is higher than 0 V and the High level output voltage VoH is lower than 5 V which is the supply voltage VDD.

In this manner, once the light emitting thyristor 210 has turned on, the gate current Ig falls substantially zero. When the light emitting thyristor 210 is OFF, the gate-cathode voltage can be lower than the breakdown voltage of the light emitting thyristor 210.

{Effects of Second Embodiment}

The combination of the optical print head 13 with the driver IC 100 that employs the gate driver 162D, 162E, 162F, or 163 provides the following effects.

The High level output of the gate drivers 162D, 162E, or and 162F is lower than the supply voltage VDD (5V). Thus, the gate-cathode voltage of the light emitting thyristor 210 is lower than the breakdown voltage of the light emitting thyristor, eliminating the risk of the light emitting thyristor 210 being damaged.

The image forming apparatus 1 according to the second embodiment and modifications 1 and 2 to the second embodiment employ the optical print head 13 that incorporates the driver IC 100, thereby offering image forming apparatus, e.g., printers, copying machines, facsimile machines, and multifunction printers (MFPs) having high space efficiency and light output efficiency. The use of the optical print head 13 may be applicable not only to a full color image forming apparatus but also to an image forming apparatus that prints monochrome images or multicolor images. The optical print head 13 is particularly suitable for a full color image forming apparatus that uses a plurality of exposing units.

{Other Modifications}

The present invention is not limited to the first embodiment, the second embodiment, and the modifications but may be further modified in a variety of ways.

While the present invention has been described in terms of the light emitting thyristors as light emitting elements, the invention may also be applied to other elements such as LEDs, organic EL elements, and heat generating resistors that are driven by a controlled voltage. For example, the invention may be applied to a printer that employs an organic EL print head incorporating an array of organic EL elements and a thermal printer that employs an array of heat generating resistors. The invention may also be applied to display elements arranged in a row or in a matrix.

The present invention may be applied not only to three-terminal elements such as light emitting thyristors but also to four-terminal thyristors or silicon semiconductor controlled switches (SCS) having a first gate and a second gate.

As is clear from the description of the embodiments of the invention, the application of the present invention may not be limited to the driving of a row of elements but may be widely applied to IC chips in any shape having either a single drive terminal or a plurality of drive terminals or to a unit that incorporates such IC chips.

The invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. A driver circuit for use with a power supply to drive a plurality of groups of light emitting elements, each light emitting element including a first terminal, a second terminal connected to a node at a predetermined potential, and a third terminal that controls electrical conduction between the first terminal and the second terminal, the driver circuit comprising:
   a first driver section commonly connected to the first terminal of a first light emitting element in a first group of the plurality of groups and the first terminal of a second light emitting element in the first group; and
   a second driver section commonly connected to the third terminal of the first light emitting element and the third terminal of a third light emitting element in a second group of the plurality of groups, the second driver section including:
   an output terminal that is commonly connected to the third terminals of the first and third light emitting elements, and that supplies a common control signal to the third terminals of the first and third light emitting elements;
   a series combination of a first PMOS transistor and a voltage level shifter, the series combination being connected between the power supply and the output terminal, the first PMOS transistor including a source that is connected to the power supply and a drain that is connected to the output terminal via the voltage level shifter; and
   a second PMOS transistor connected between the output terminal and ground, the second PMOS transistor including a drain connected to the ground and a source directly connected to the output terminal and the series combination,
   wherein the second driver section further includes:
   an input terminal;
   a first inverter connected to the input terminal;
   a timing adjusting circuit connected between the first inverter and a gate of the first PMOS transistor; and
   a second inverter connected between the first inverter and a gate of the second PMOS transistor, and
   wherein the timing adjusting circuit operates such that the first PMOS transistor and the second PMOS transistor are switched between an on-state and an-off state substantially simultaneously.

2. The driver circuit according to claim 1, wherein the timing adjusting circuit is formed of an analog switch having a parallel connection of an NMOS transistor and a third PMOS transistor.

3. The driver circuit according to claim 1, wherein the voltage level shifter is formed of a diode-connected third PMOS transistor.

4. The driver circuit according to claim 1, wherein the voltage level shifter is formed of a forward biased diode.

5. The driver circuit according to claim 1, wherein the node at the predetermined potential is the ground.

6. The driver circuit according to claim 1, wherein the first driver section drives first current flowing through the first terminals, and the second driver section drives second current flowing through the third terminals, the second current being at least a portion of the first current.

7. A driver apparatus comprising a driver circuit according to claim 1 and an array of the light emitting elements driven by the driver circuit.

8. An image forming apparatus comprising a driver apparatus according to claim 7.

9. The driver circuit according to claim 1, wherein each of the light emitting elements is a light emitting thyristor.

10. A driver circuit for use with a power supply to drive a plurality of groups of light emitting elements, each light emitting element including a first terminal, a second terminal connected to a node at a predetermined potential, and a third terminal that controls electrical conduction between the first terminal and the second terminal, the driver circuit comprising:
- a first driver section commonly connected to the first terminal of a first light emitting element in a first group of the plurality of groups and the first terminal of a second light emitting element in the first group; and
- a second driver section commonly connected to the third terminal of the first light emitting element and the third terminal of a third light emitting element in a second group of the plurality of groups, the second driver section including:
- an output terminal that is commonly connected to the third terminals of the first and third light emitting elements, and that supplies a common control signal to the third terminals of the first and third light emitting elements;
- a series combination of a first PMOS transistor and a voltage level shifter, the series combination being connected between the power supply and the output terminal, the first PMOS transistor including a source that is connected to the power supply via the voltage level shifter and a drain that is connected to the output terminal; and
- a second PMOS transistor connected between the output terminal and ground, the second PMOS transistor including a drain connected to the ground and a source directly connected to the output terminal and the series combination, wherein the second driver section further includes:
- an input terminal;
- a first inverter connected to the input terminal;
- a timing adjusting circuit connected between the first inverter and a gate of the first PMOS transistor; and
- a second inverter connected between the first inverter and a gate of the second PMOS transistor, and
- wherein the timing adjusting circuit operates such that the first PMOS transistor and the second PMOS transistor are switched between an on-state and an-off state substantially simultaneously.

11. The driver circuit according to claim 10, wherein the timing adjusting circuit is formed of an analog switch having a parallel connection of an NMOS transistor and a third PMOS transistor.

12. The driver circuit according to claim 10, wherein the voltage level shifter is formed of a diode-connected third PMOS transistor.

13. The driver circuit according to claim 10, wherein the voltage level shifter is formed of a forward biased diode.

14. The driver circuit according to claim 10, wherein the node at the predetermined potential is the ground.

15. The driver circuit according to claim 10, wherein the first driver section drives first current flowing through the first terminals, and the second driver section drives second current flowing through the third terminals, the second current being at least a portion of the first current.

16. A driver apparatus comprising a driver circuit according to claim 10 and an array of the light emitting elements driven by the driver circuit.

17. An image forming apparatus comprising a driver apparatus according to claim 16.

18. The driver circuit according to claim 10, wherein each of the light emitting elements is a light emitting thyristor.

* * * * *